(12) United States Patent
Shibata et al.

(10) Patent No.: US 8,270,214 B2
(45) Date of Patent: Sep. 18, 2012

(54) NONVOLATILE SEMICONDUCTOR MEMORY DEVICE

(75) Inventors: Noboru Shibata, Kanagawa-ken (JP); Kazunori Kanebako, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 207 days.

(21) Appl. No.: 12/840,567

(22) Filed: Jul. 21, 2010

(65) Prior Publication Data

US 2011/0019470 A1    Jan. 27, 2011

(30) Foreign Application Priority Data

Jul. 22, 2009   (JP) ................................. 2009-171371

(51) Int. Cl.
  *G11C 11/34*   (2006.01)
(52) U.S. Cl. .......... 365/185.03; 365/185.11; 365/185.18
(58) Field of Classification Search ............. 365/185.03, 365/185.11, 185.18, 185.09, 185.22, 185.23, 365/226, 191, 185.28
See application file for complete search history.

(56) References Cited

U.S. PATENT DOCUMENTS

2007/0285980 A1   12/2007   Shimizu et al.
2008/0175057 A1*  7/2008   Sugiura et al. ........... 365/185.11

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

A semiconductor memory device, in which a multi-bit region including multi-bit memory cells that store data of two or more bits and a region including memory cells that store data of bits that are less than the bits of the data stored in the multi-bit memory cells are installed, is provided, which can perform a high-speed writing and lengthen the life span of the product without increasing the storage capacity of the region of the memory cells storing the data of bits that are less than the bits of the data in the multi-bit memory cells. The semiconductor memory device includes a plurality of memory cells which store n-bit (where n is a natural number that is equal to or larger than 2) data for one cell. Among the plurality of memory cells, h-bit (h≦n) data is stored in a memory MLC of a first region MLB, and i-bit (i<h) data is stored in a memory SLC of a second region SLB. If the number of rewritings in the memory cells of the second region SLB reaches a prescribed value, the i-bit data is stored in the memory of the first region MLB rather than the memory cells of the second region SLB.

4 Claims, 26 Drawing Sheets

| | Cell (P-Well) | Cell (N-Well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Read | Vss (0V) | Vss (0V) | Vss (0V) | Vss (0V) | Vdd (2.5V) | Vdd (2.5V)/Vreadh |

Fig. 6

(a) Rough1 Program (b) Neighboring Cell Program (c) Rough2 Program (d) Neighboring Cell Program (e) Fine Program

NONVOLATILE SEMICONDUCTOR MEMORY DEVICE

CROSS-REFERENCE TO RELATED APPLICATION

This application is based upon and claims the benefit of priority from the prior Japanese Patent Application No. 2010-171371, filed on Jul. 22, 2010, the entire contents of which are incorporated herein by reference.

BACKGROUND OF THE INVENTION

The present invention relates to, for example, a NAND flash memory, and more particularly to a semiconductor memory device which can store multi-bit data.

In a NAND flash memory, all of the cells which are parallel in a row direction or half the number of cells are connected to a read/write latch circuit through respective bit lines. A write or read operation is collectively performed with respect to all of the cells which are parallel in a row direction or half the number of cells (e.g. cells of 2-8 kB). In a memory cell, electrons are taken out of the memory cell by an erase operation to make a threshold value voltage negative, and electrons are introduced into the memory cell by a write operation to set the threshold value voltage positive.

In order to increase the storage capacity of a NAND flash memory, a multi-bit memory that stores two or more bits in one cell has been developed. For example, in order to store two bits in one cell, four threshold value voltages are necessary to be set, and it is necessary to narrow the distribution of the threshold value voltages for one cell in comparison to a memory that stores one bit in one cell. Due to this, the write speed is lowered.

Also, if a neighboring cell is written by a coupling between neighboring cells through miniaturization of memory cells, the threshold value voltage of the cell first written is changed. Due to this, for example, a first memory cell is roughly written, a second memory cell, which is adjacent to the first memory cell, is roughly written, and then the threshold value voltage of the first memory cell is written as the original threshold value voltage. Also, a method has been performed, whereby the first memory cell is roughly written, the second memory cell, which is adjacent to the first memory cell, is roughly written, a third memory cell, which is adjacent to the second memory cell, (which is apart for two cells from the first memory cell) is roughly written, and then the original threshold value voltage is written in the first memory cell. By such a write method, the coupling between the neighboring cells is suppressed, and a plurality of threshold value voltages is set in one memory cell to make plural-bit storage possible.

However, the above-described write method has the problem that it is necessary to repeatedly perform the write operation up to several times with respect to one memory cell, and the write speed is low. Also, the increase in write frequency shortens the life span of the memory cell.

Accordingly, a write method, in which a multi-bit region MLB that includes multi-bit memory cells each storing two or more bits and a binary region SLB of memory cells each storing bits which are smaller than that of the multi-bit memory cell, for example, one bit, are installed, has been developed (for example, see Patent Document 1).

In this write method, data provided from the outside is first stored in SLB, and thereafter, the data in SLB is transferred to MLB to be stored as multi-bit data. Since high-speed writing is possible in SLB, the write speed can be heightened.

However, although the memory cells in SLB are frequently written, the memory cells in MLB have a smaller number of writings than that of the memory cells in SLB. Due to this, the memory cells in SLB deteriorate quickly in comparison to the memory cells in MLB. The deterioration of the memory cells causes performance deterioration of the NAND flash memory. Accordingly, in order to suppress the performance deterioration of the NAND flash memory and to realize high-speed writing, the storage capacity of SLB to the storage capacity of MLB has been considered. Specifically, if it is assumed that a memory cell in MLB stores two bits per cell, a memory cell in SLB stores one bit per cell, the number of rewritings in the memory cell in MLB is set to 1 k (k=1000), and the number of rewritings in the memory cell in SLB is set to 100 k, the memory cell in SLB has 100 times the number of rewritings of the memory cell in MLB, and thus it is sufficient if the number of blocks in SLB is 2% of the number of blocks in MLB.

However, if it is assumed that the number of rewritings in the memory cell in MLB is set to 1 k, and the number of rewritings in the memory cell in SLB is set to 50 k, it is necessary that SLB is 4% of MLB. Further, if it is assumed that the number of rewritings in the memory cell in MLB is set to 1 k, and the number of rewritings in the memory cell in SLB is set to 10 k, it is necessary that SLB is 20% of MLB. As described above, if the number of rewritings in SLB approximates the number of rewritings in MLB, a very large SLB is necessary in advance.

BRIEF SUMMARY OF THE INVENTION

In accordance with the present invention, a nonvolatile semiconductor memory device comprising a plurality of memory cells which store n-bit (where n is a natural number that is equal to or larger than 2) data for one cell, wherein among the plurality of memory cells, h-bit (h≦n) data is stored in memory cells of a first region, i-bit (i<h) data is stored in memory cells of a second region, and if the number of rewritings in the memory cells of the second region reaches a prescribed value, the i-bit data is stored in the memory cells of the first region rather than the memory cells of the second region, and in the memory cells of the first region, a region for storing the i-bit data and a region for storing the h-bit data are exchanged with each other whenever a rewrite operation is performed.

A nonvolatile semiconductor memory device comprising a plurality of memory cells which store n-bit (where n is a natural number that is equal to or larger than 2) data for one cell, wherein among the plurality of memory cells, h-bit (h≦n) data is stored in memory cells of a first region, i-bit (i<h) data is stored in memory cells of a second region, and if the number of rewritings in the memory cells of the second region reaches a prescribed value, the memory cells of a portion of the first region is set as a third region that is a new second region, and the i-bit data is stored in the third region rather than the memory cells of the second region.

A nonvolatile semiconductor memory device comprising a plurality of memory cells which store n-bit (where n is a natural number that is equal to or larger than 2) data for one cell, wherein among the plurality of memory cells, h-bit (h≦n) data is stored in memory cells of a first region, i-bit (i<h) data is stored in memory cells of a second region, the first region and the second region are exchanged whenever a rewrite operation is performed, and if the number of rewritings reaches a prescribed value, no data is written.

A nonvolatile semiconductor memory device comprising first and second memory cell arrays composed of a plurality of memory cells which store n-bit (where n is a natural number that is equal to or larger than 2) data for one cell, wherein among the plurality of memory cells of the first and second memory cell arrays, h-bit (h≦n) data is stored in memory cells of a first region, and i-bit (i<h) data for storing the h-bit data are dividedly stored in memory cells of a second region.

BRIEF DESCRIPTION OF THE DRAWINGS

FIG. 6 is a diagram illustrating voltages at respective points in erase, program, and read operations of FIG. 5;

DETAILED DESCRIPTION OF THE INVENTION

Hereinafter, preferred embodiments of the present invention will be described in detail with reference to the accompanying drawings.

First Embodiment

Figure 1:
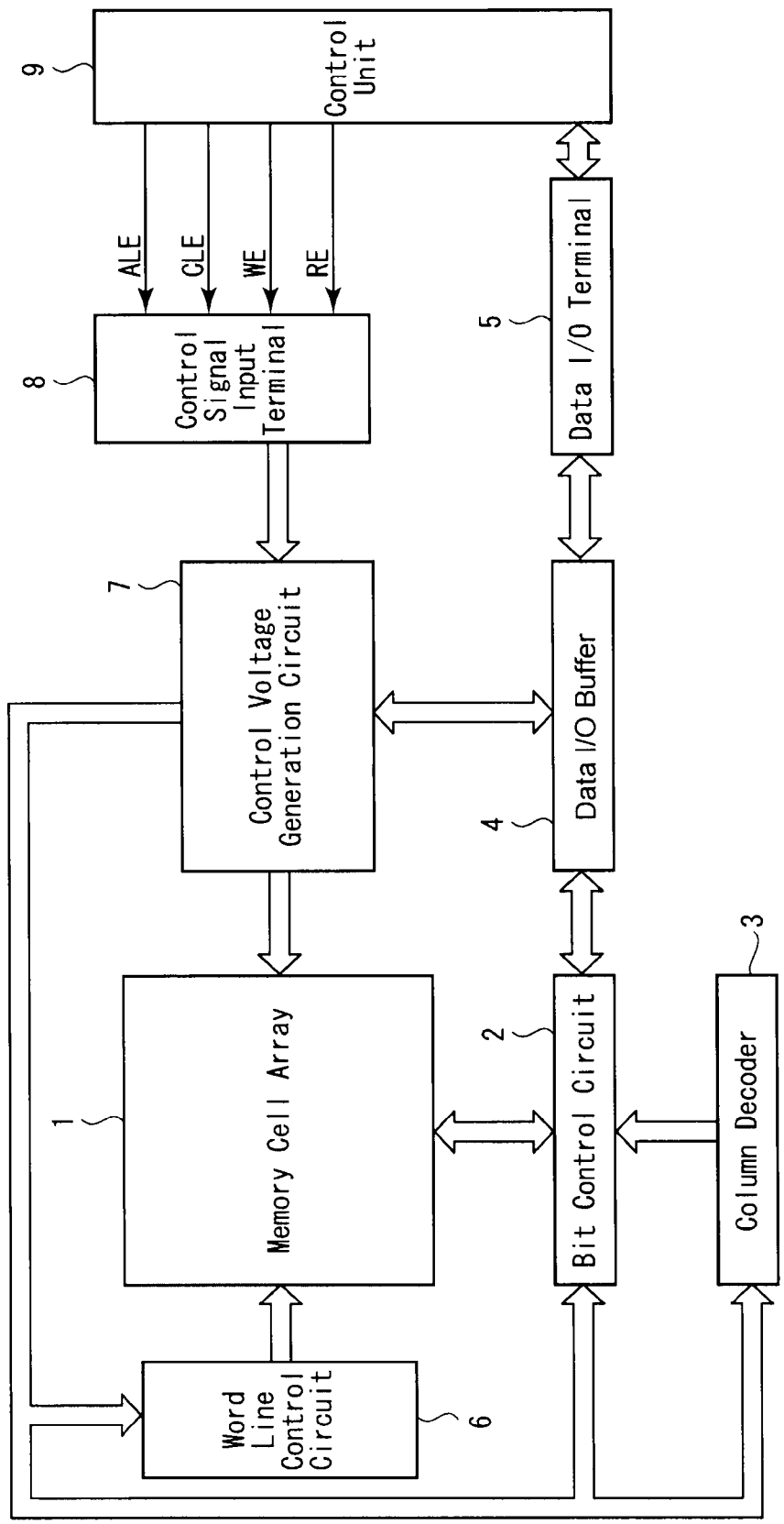
FIG. 1 is a block diagram illustrating a configuration of a NAND flash memory as a semiconductor memory device that is applied to an embodiment of the present invention.

FIG. 1 is a block diagram illustrating a configuration of a NAND flash memory as a semiconductor memory device that stores two values (one bit) or four values (two bits) in a memory cell.

A memory cell array 1 includes a plurality of bit lines, a plurality of word lines, and a common source line. In the memory cell array 1, memory cells, which are EEPROM cells that can electrically rewrite data, are arranged in the form of a matrix. To this memory cell array 1, a bit control circuit (which is also called a page buffer S/A) 2 for controlling bit lines and a word line control circuit 6 are connected.

The bit line control circuit 2 reads data of memory cells inside the memory cell array 1, detects the state of the memory cells inside the memory cell array 1 through bit lines, or writes data in the memory cells by applying a write control voltage to the memory cells of the memory cell array 1 through the bit lines. The bit line control circuit 2 is connected to a column decoder 3 and a data input/output buffer 4. A data storage circuit in the bit line control circuit 2 is selected by the column decoder 3. The data of the memory cell read by the data storage circuit is output from a data input/output terminal 5 to the outside through the data input/output buffer 4. The data input/output terminal 5 is connected to a control unit 9. The control unit 9, for example, is configured by a microcomputer, and receives the data output from the data input/output terminal 5. Further, the control unit 9 outputs various kinds of commands CMD for controlling the operation of the NAND flash memory, addresses ADD, and data DT. The write data input from the control unit 9 to the data input/output terminal 5 is supplied to the data storage circuit selected by the column decoder 3 through the data input/output buffer 4, and the command and the address are supplied to a control signal and control voltage generation circuit 7. Also, the control unit 9, to be described later, counts the number of erases during data erase, and writes data regarding the counted number of erase in the corresponding SLB.

A word line control circuit 6 is connected to the memory cell array 1. This word line control circuit 6 selects a word line inside the memory cell array 1, and applies a voltage that is necessary for a read, write, or erase operation to the selected word line.

The memory cell array 1, the bit line control circuit 2, the column decoder 3, the data input/output buffer 4, and the word line control circuit 6 are connected to the control signal and control voltage generation circuit 7, and are controlled by the control signal and control voltage generation circuit 7. The control signal and control voltage generation circuit 7 is connected to the control signal input terminal 8, and is controlled by control signals, such as ALE (Address Latch Enable), CLE (Command Latch Enable), and WE (Write Enable), which are input from the control unit 9 through the control signal input terminal 8. The control signal and control voltage generation circuit 7 generates voltages for the word line or the bit line during writing of data, and generates voltages that are supplied to a well. The control signal and control voltage generation circuit 7 includes a boost circuit such as, for example, a charge pump circuit, and can generate program voltages and other high voltages.

The bit line control circuit 2, the column decoder 3, the word line control circuit 6, and the control signal and control voltage generation circuit 7 constitute a write circuit and a read circuit.

Figure 2:
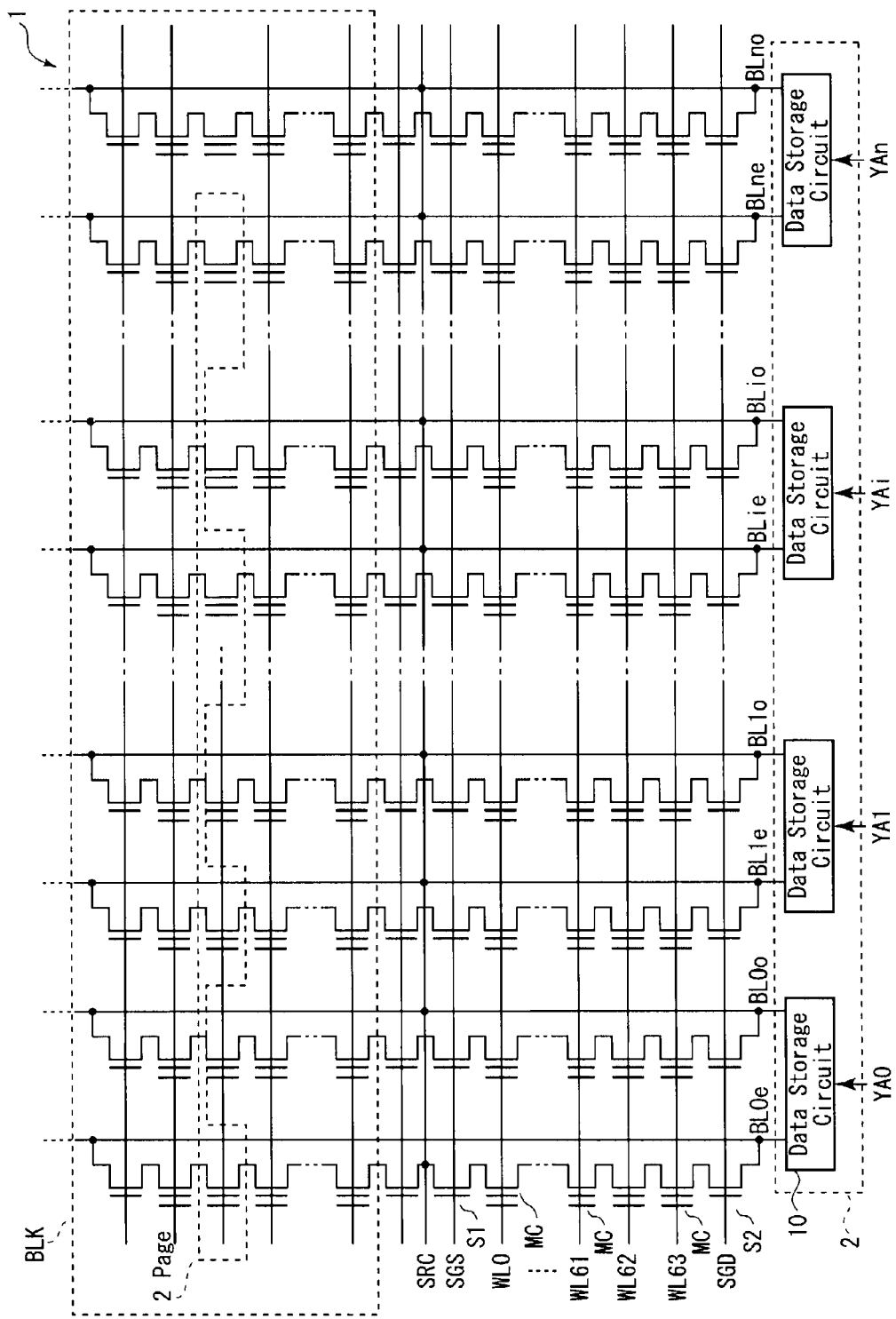
FIG. 2 is a circuit diagram illustrating a configuration example of a memory cell array and a bit line control circuit as illustrated in FIG. 1.

FIG. 2 illustrates a configuration example of a memory cell array 1 and a bit line control circuit 2 as illustrated in FIG. 1. In the memory cell array 1, a plurality of NAND units is arranged. One NAND unit includes memory cells MC composed of, for example, 64 EEPROMs connected in series and selection gates S1 and S2. The selection gate S2 is connected to a bit line BL0e, and the selection gate S1 is connected to a source line SRC. Control gates of memory cells MC arranged in respective rows are commonly connected to word lines WL0 to WL63. Also, the selection gate S2 is commonly connected to a select line SGD, and the selection gate 51 is commonly connected to a select line SGS.

The bit line control circuit 2 has a plurality of data storage circuits 10. To the respective data storage circuit 10, pairs of bit lines (BL0e, BL0o), (BL1e, BL1o), . . . (BLie, BLio), and (BLne, BLno) are connected.

The memory cell array 1, as indicated by dashed lines, includes a plurality of blocks. Each block is composed of a plurality of NAND units, and data is erased, for example, in a block unit. Also, an erase operation is simultaneously performed with respect to two bit lines which are connected to the data storage unit 10.

Also, a plurality of memory cells (memory cells in a range surrounded by dashed line), which are arranged every other bit line and are connected to one word line, constitute one sector. For each sector, data is written and read. That is, half the number of memory cells among a plurality of memory cells arranged in a row direction are connected to the corresponding bit lines. Due to this, a read or write operation is performed with respect to half the number of memory cells arranged in a row direction.

During a read operation, a program verify operation, and a program operation, one of two bit lines BLie and BLio which are connected to the data storage circuit 10 is selected according to address signals YA0, YA1, . . . YAi, . . . YAn supplied from the outside. Further, according to an external address, one word line is selected to select two pages as indicated as a dashed line. The switchover of two pages is performed by addresses.

In the case of storing two bits in one cell, two pages are selected, and in the case of storing one bit, three bits, and four bits in one cell, one page, three pages, and four pages are selected, respectively.

Figure 3:
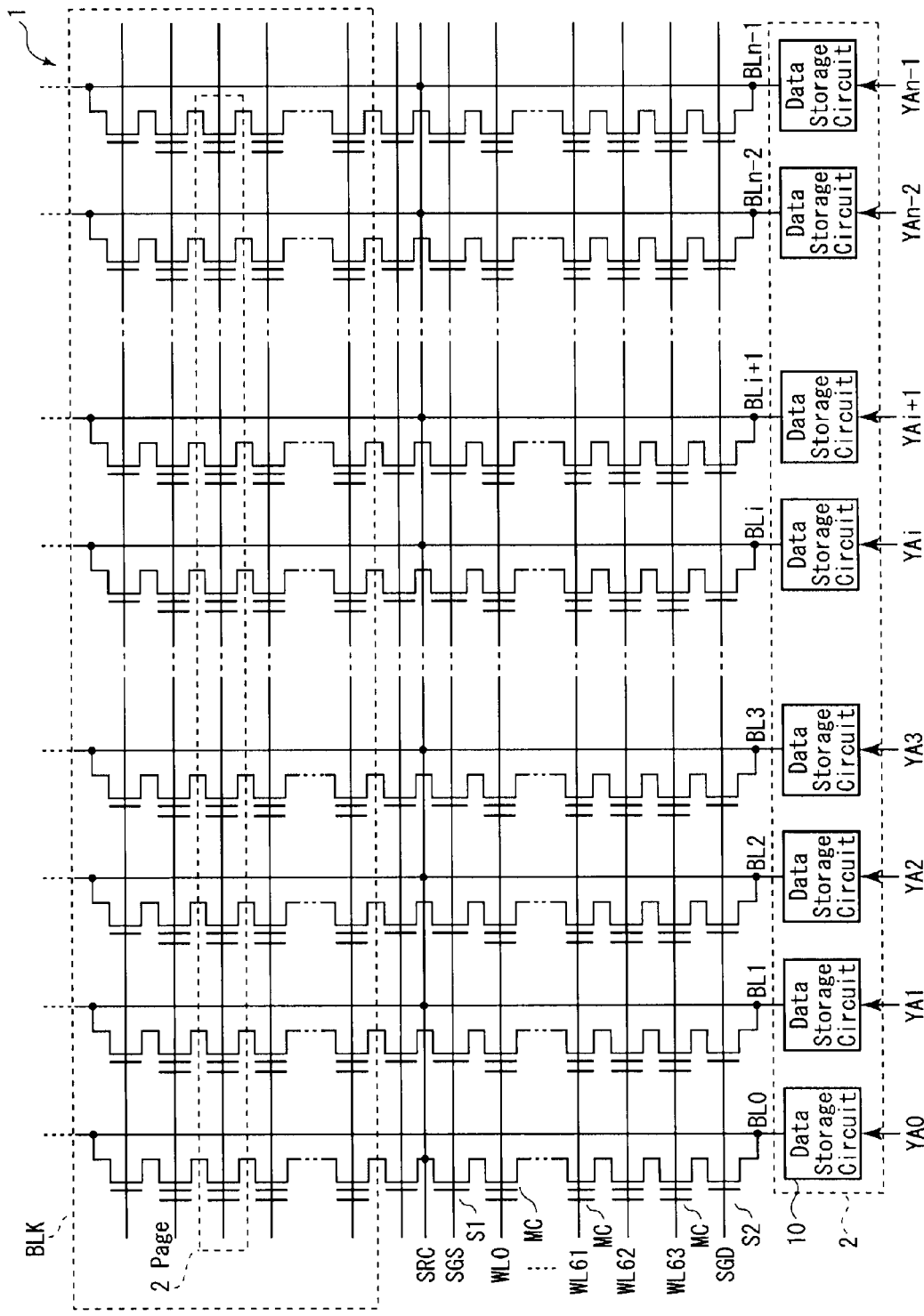
FIG. 3 is a circuit diagram illustrating another configuration example of a memory cell array and a bit line control circuit as illustrated in FIG. 1.

FIG. 3 is a circuit diagram illustrating another configuration example of a memory cell array 1 and a bit line control circuit 2 as illustrated in FIG. 1. In the case of a configuration as illustrated in FIG. 2, two bit lines BLie and BLio are connected to the data storage circuit 10. By contrast, in the case of a configuration as illustrated in FIG. 3, the respective bit lines are connected to the data storage circuit 10, and the plurality of memory cells which are arranged in a row direction are all connected to corresponding bit lines. Due to this, a read or write operation is performed with respect to all memory cells which are arranged in a row direction.

Although the following description can be applied to both the configuration as illustrated in FIG. 2 and the configuration as illustrated in FIG. 3, the configuration as illustrated in FIG. 3 will be described.

Figure 4:
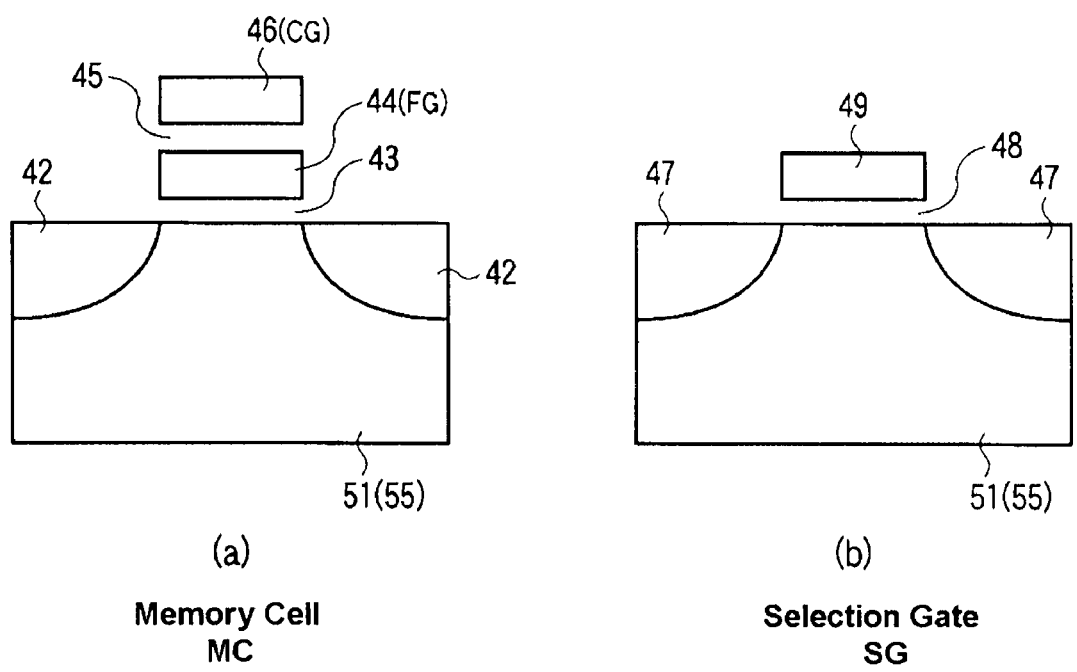
FIG. 4A is a sectional view of a memory cell.
FIG. 4B is a sectional view of a selection gate.

FIGS. 4A and 4B are sectional views of a memory cell and a selection transistor. FIG. 4A illustrates a memory cell. On a substrate 51 (a P-type well region 55 to be described later), an N-type diffusion layer 42 is formed as a source and a drain of a memory cell. A floating gate (FG) 44 is formed on the P-type well region 55 via a gate insulating layer 43, and a control gate (CG) 46 is formed on the floating gate 44 via the gate insulating layer 45. FIG. 4B illustrates a selection gate. An N-type diffusion layer 47 is formed on the P-type well region 55 as the source and drain of the memory cell. A control gate 49 is formed on the P-type well region 55 via a gate insulating layer 48.

Figure 5:
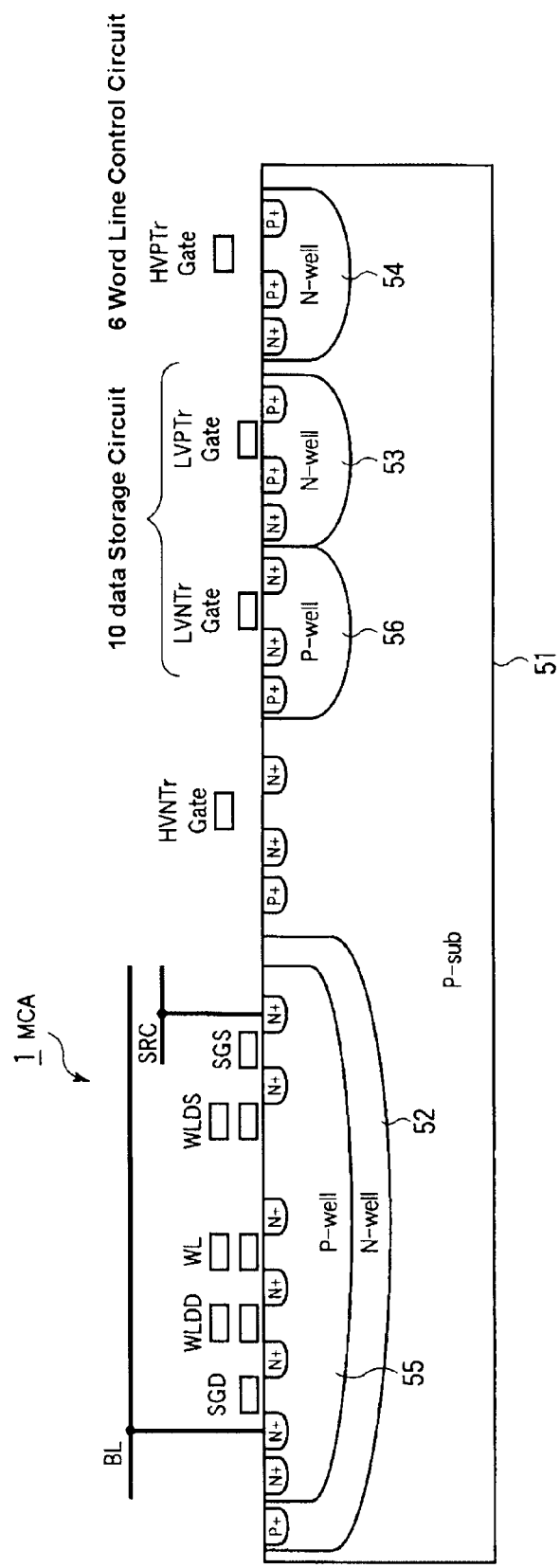
FIG. 5 is a sectional view of a semiconductor memory device.

FIG. 5 is a sectional view of a NAND flash memory. For example, in the P-type semiconductor substrate 51, N-type well regions 52, 53, and 54 and a P-type well region 56 are formed. A P-type well region 55 is formed in the N-type well region 52, and a low-voltage N-channel transistor LVNTr that constitutes the memory cell array 1 is formed in the P-type well region 55. Further, in the N-type well region 53 and the P-type well region 56, a low-voltage P-channel transistor LVPTr and a low-voltage N-channel transistor LVNTr, which constitute the data storage circuit 10, are formed. In the substrate 51, a high-voltage N-channel transistor HVNTr for connecting the bit line and the data storage circuit 10 is formed. Also, in the N-type well region 54, for example, a high-voltage P-channel transistor HVPTr that constitutes a word line drive circuit and so on is formed. As illustrated in FIG. 5, the high-voltage transistors HVNTr and HVPTr have a thick gate insulating layer in comparison to the low-voltage transistors LVNTr and LVPTr.

FIG. 6 illustrates an example of voltages which are supplied to various points appearing in FIG. 5. In erase, program, and read operations, voltages as illustrated in FIG. 6 are supplied to respective regions. Here, Vera denotes a voltage that is applied to the substrate during data erase, VSS denotes a ground voltage, and Vdd denotes a power supply voltage. VpgmH denotes a voltage that is applied to a gate of a N-channel MOS transistor in a row decoder during date write, and corresponds to an electric potential for passing a write voltage Vpgm of a word line without lowering the voltage as low as a threshold value voltage of the N-channel MOS transistor. That is, VpgmH is a voltage VpgM+Vth (where, Vth is a threshold value voltage of the N-channel MOS transistor) that is supplied to the word line. VreadH denotes a voltage that is applied to the gate of the N-channel MOS transistor in the row decoder during date read, and corresponds to an electric potential for passing a read voltage Vread without lowering the voltage as low as the threshold value voltage of the N-channel MOS transistor. That is, VreadH is a voltage Vread+Vth (where, Vth is the threshold value voltage of the N-channel MOS transistor) that is supplied to the word line during data read.

In addition, Vpass is a voltage that is supplied to the word line of a non-selected cell during the data write, and Vread is a voltage that is supplied to a non-selected word line during the data read.

Figure 7:
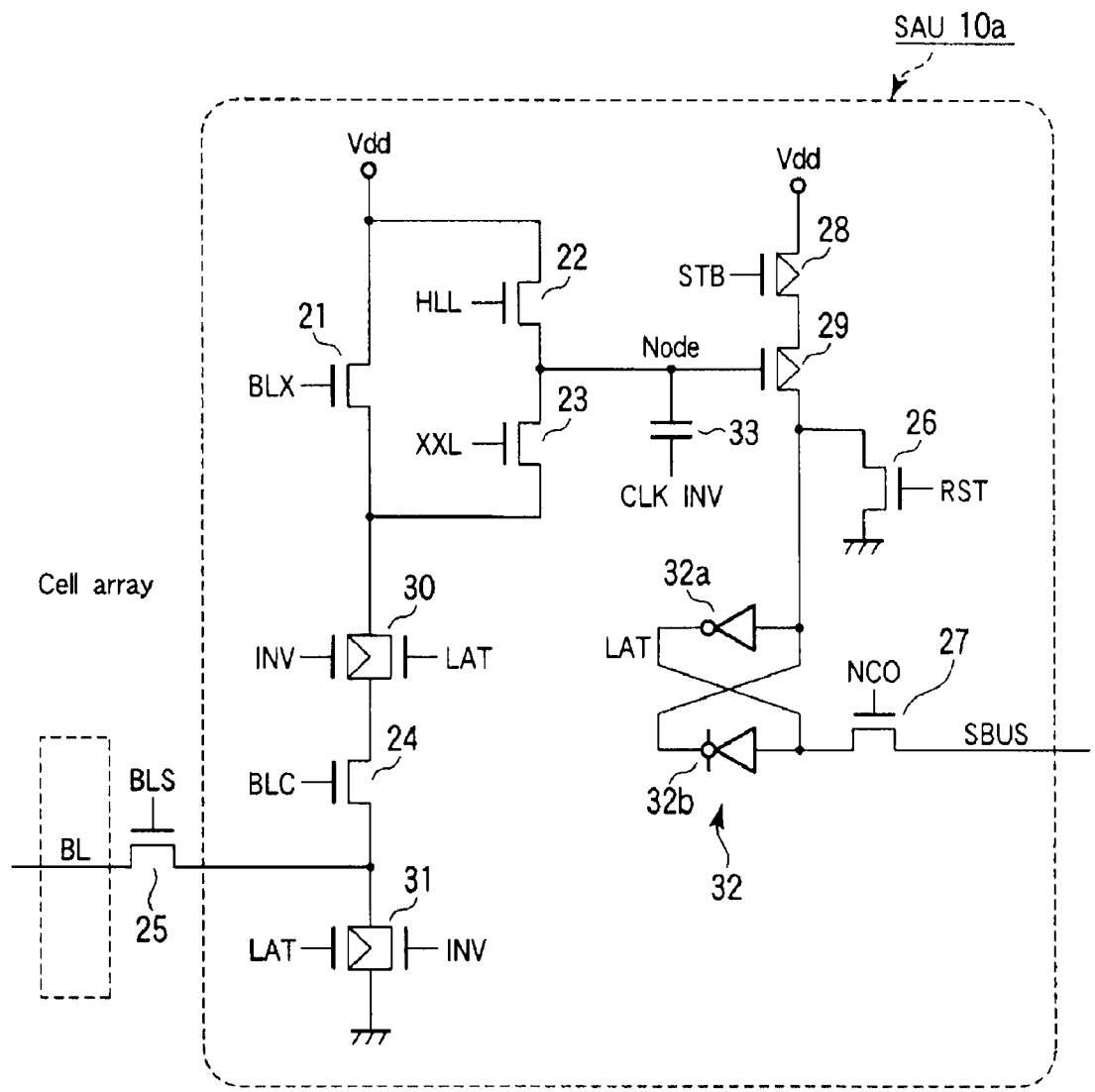
FIG. 7 is a circuit diagram of a portion of a data storage circuit as illustrated in FIGS. 2 and 3, that is, a sense amplifying unit.
Figure 8:
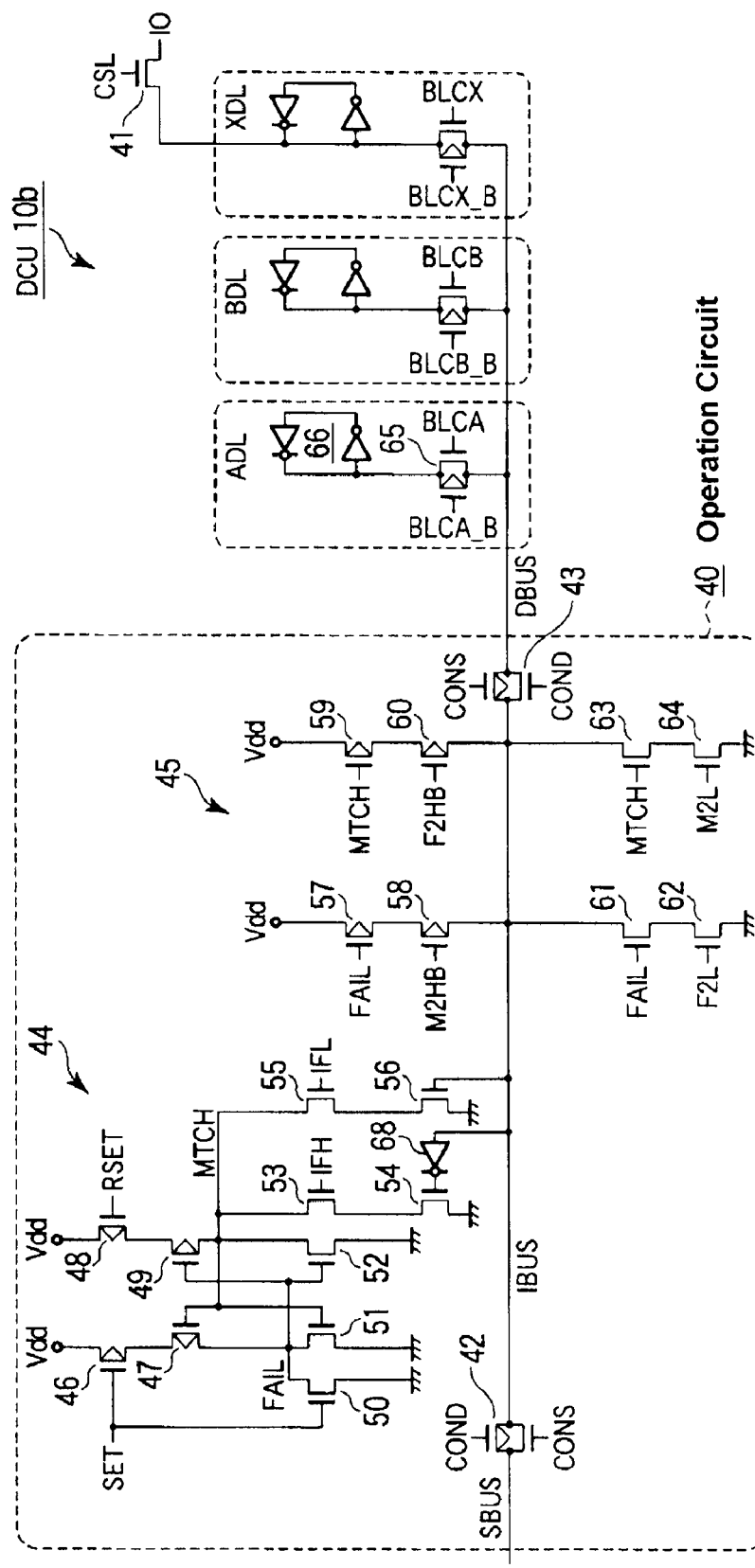
FIG. 8 is a circuit diagram of a portion of a data storage circuit as illustrated in FIGS. 2 and 3, that is, a data control unit.

FIGS. 7 and 8 illustrate an example of a data storage circuit 10 as illustrated in FIG. 3. The data storage circuit 10 is composed of a sense amplifying unit (SAU) 10a as illustrated in FIG. 7 and a data control unit (DCU) 10b as illustrated in FIG. 8.

In FIG. 7, the sense amplifying unit 10a includes a plurality of N-channel MOS transistors (hereinafter referred to as "NMOS") 21 to 27 and a plurality of P-channel MOS transistors (hereinafter referred to as "PMOS") 28 and 29, transfer gates 30 and 31, a latch circuit 32, and a capacitor 33. The latch circuit 32 is composed of, for example, clocked inverter circuits 32*a* and 32*b*.

One end of a current path of the NMOS 21 is connected to a node to which the power Vdd is supplied, and the other end thereof is grounded through the transfer gate 30, the NMOS 24, and the transfer gate 31. To a connection node of the NMOS 24 and the transfer gate 31, one end of a current path of the NMOS 25 is connected. The other end of the NMOS 25 is connected to a bit line BL that is arranged in the memory cell array. A series circuit of the NMOS 22 and 23 is connected in parallel to the NMOS 21.

Also, one end of a current path of the PMOS 28 is connected to a node to which the power Vdd is supplied, and the other thereof is connected to an input terminal of an inverter circuit 32*a* that constitutes the latch circuit 32 through the PMOS 29 and is grounded through the NMOS 26. An input terminal of the clocked inverter circuit 32*b*, which is connected in cross to the inverter circuit 32*a*, is connected to the data control unit (DCU) 10*b* through the NMOS 27. Also, a gate of the PMOS 29 is connected to a connection node of the NMOS 22 and 23, and this connection node is connected to one end of the capacitor 33. A clock signal CLK is supplied to the other end of the capacitor 33.

A signal BLX is supplied to the gate of the NMOS 21. A signal LAT on the output terminal of the inverter circuit 32*a* that constitutes the latch circuit 32 is supplied to the gate of the NMOS that constitutes the transfer gate 30, and a signal INV on the input terminal of the inverter circuit 32*a* is supplied to the gate of the PMOS transistor. A signal BLC is supplied to the gate of the NMOS 24, and a signal BLS is supplied to the gate of the NMOS 25.

A signal HLL is supplied to the gate of the NMOS 22, and a signal XXL is supplied to the gate of the NMOS 23.

A signal STB is supplied to the gate of the PMOS 28, and a reset signal RST is supplied to the gate of the NMOS 26. A signal NCO is supplied to the gate of the NMOS 27.

The operation of the sense amplifying unit will be briefly described.

Record Operation

In the case of recording data in a memory cell, the signal STB first goes to a high level (hereinafter referred to as a "H level"), the reset signal RST becomes H level, and the latch circuit 32 is reset, so that the signal LAT becomes H level, and the signal INV becomes low level (hereinafter referred to as a "L level").

Then, the signal NCO becomes H level, and data is received from the data control unit 10*b*. If this data becomes L level ("0") that indicates a write operation, the signal LAT becomes L level and the signal INV becomes H level. Also, if the data becomes H level ("1") that indicates non-write, the data in the latch circuit 32 is not changed, and the signal LAT becomes H level, and the signal INV becomes L level.

Then, if the signals BLX, BLC, and BLS become H level in a state where the signal LAT of the latch circuit is at L level and the signal INV is at H level (write), the transfer gate 30 is turned off, and the transfer gate 31 is turned on to make the bit line BL at Vss. In this state, if the word line is at the program voltage Vpgm, data is written in the memory cell.

On the other hand, if the signal LAT is at H level and the signal INV is at L level (non-write) in the latch circuit 32, the transfer gate 30 is turned on and the transfer gate 31 is turned off, so that the bit line BL is charged to Vdd. Accordingly, in the case where the word line is at Vpgm, the channel of the cell is boosted to a high electric potential, and thus no data is recorded in the memory cell.

Read Operation and Program Verify Read Operation

In the case of reading data from a memory cell, the reset signal RST first becomes H level, and the latch circuit 32 is reset, so that the signal LAT becomes H level and the signal INV becomes L level. Thereafter, the signals BLS, BLC, BLX, HLL, and XXL become predetermined voltages, respectively, and the bit line BL is charged. Also, the node of the capacitor 33 is charged to Vdd. Here, if the threshold value voltage of the memory cell is higher than the read level, the memory cell is in an off state, and the bit line is kept at H level. That is, the node is kept at H level. Also, if the threshold value voltage of the memory cell is lower than the read level, the memory cell is in an on state, and the bit line BL is discharged. Accordingly, the bit line BL becomes L level, and the node becomes L level.

Then, if the signal STB becomes L level in a state where the memory cell is turned on, the PMOS 29 is turned on since the node is at L level, and the signal INV of the latch circuit 32 becomes H level while the signal LAT becomes L level. On the other hand, if the memory cell is turned off, the signal INV of the latch circuit 32 is kept at L level and the signal LAT is kept at H level.

Thereafter, if the signal NCO becomes H level, the NMOS 27 is turned on, and the data of the latch circuit 32 is transferred to the data control unit 10*b*.

After the write operation, the program verify operation for verifying the threshold value voltage of the memory cell is the same as the read operation as described above.

FIG. 8 illustrates an example of a data control unit (DCU) 10*b*.

The data control unit 10*b* as illustrated in FIG. 8 is configured by an operation circuit 40, a plurality of data latch circuits ADL, BDL, and XDL, and NMOS 41.

The operation circuit 40 is composed of a bus (hereinafter referred to as "IBUS"), transfer gates 42 and 43 that operate complementarily, a latch circuit 44 that latches the data of IBUS, and a setting circuit 45 that set the levels of the data latch circuits ADL, BDL, and XDL according to the data of the latch circuit 44.

The transfer gate 42 is operated by a complementary signal COND and a signal CONS, and connects the bus (which is hereinafter described as SBUS) of the sense amplifying unit (SAU) 10*a* to the IBUS. The transfer gate 43 is operated by the complementary signal CONS and the signal COND, and connects the IBUS to the bus (which is hereinafter described as DBUS) to which the data latch circuits ADL, BLD, and XDL are connected. When the transfer gate 42 is turned on, the transfer gate 43 is turned off, while when the transfer gate 42 is turned off, the transfer gate 43 is turned on.

The latch circuit 44 is composed of a plurality of PMOS 46 to 49, a plurality of NMOS 50 to 56, and an inverter circuit 68. A set signal SET is supplied to the gates of the PMOS 46 and the NMOS 50, and a reset signal RESET is supplied to the gate of the PMOS 48. A signal IFH is supplied to the gate of the NMOS 53, and a signal IFL is supplied to the gate of the NMOS 55. The gate of the NMOS 54 is connected to the IBUS through the inverter circuit 68, and the gate of the NMOS 56 is connected to the IBUS.

The setting circuit 45 is composed of PMOS 57 to 60 and NMOS 61 to 64. A signal FAIL is supplied to the gate of the PMOS 57 and the gate of the NMOS 61. This signal FAIL is a signal of a connection node between the PMOS 47, which is one output terminal of the latch circuit 44, and the NMOS 51. A signal MTCH is supplied to the gates of the PMOS 59 and the NMOS 63. This signal MTCH is a signal of a connection node between the PMOS 49, which is the other output terminal of the latch circuit 44, and the NMOS 52. Further, a signal M2HB is supplied to the gate of the PMOS 58, and a signal F2HB is supplied to the gate of the PMOS 60. A signal F2L is supplied to the gate of the NMOS 62, and a signal M2L is supplied to the gate of the NMOS 64.

The data latch circuits ADL, BDL, and XDL have the same configuration, and are composed of a latch circuit 66 and a transfer gate 65 that connects the latch circuit 66 to the DBUS. The transfer gate 65 is controlled by signals BLCA, BLOB, and BLCX. The data latch circuit XDL is connected to an input/output terminal IO through the NMOS 41. A signal CSL is supplied to the gate of the NMOS 41.

The data control unit 10b, as described above, maintains the write data, and during the reading operation, it maintains the data read from the memory cell.

The two-bit write data that is supplied from the data input/output buffer 6 is latched bit by bit, for example, in the data latch circuits ADL and BDL through the data latch circuit XDL.

The operation circuit 40 as illustrated in FIG. 8 can perform AND, OR, and exclusive NOR operations with respect to the data of the data latch circuits ADL and BDL. For example, in the case of an AND operation, the data maintained in the data latch circuits ADL and BDL are output to the DBUS and the IBUS. In this case, only in the case where the data maintained in the data latch circuits ADL and BDL are all "1", the IBUS becomes H level, and otherwise, the IBUS becomes L level. That is, the IBUS becomes "1" only during the non-write operation, and the IBUS becomes "0" during the write operation. The write operation is performed by transferring the data to the sense amplifying unit 10a as illustrated in FIG. 7 through the SBUS.

It is also possible to arrange one operation circuit 40 as illustrated in FIG. 8 with respect to a plurality of sense amplifying units (SAU) 10a as illustrated in FIG. 7 and a plurality of data control units (DCU) 10b as illustrated in FIG. 8. Accordingly, the circuit area can be reduced.

The operation of the operation circuit 40 can be diversely modified. For example, diverse control methods can be applied to one logical operation, and if necessary, the control method can be changed.

Since the NAND flash memory is a multi-bit memory, two-bit data can be stored in one cell. The switchover of two bits is performed by addresses (a first page and a second page). In the case of storing two bits in one cell or in the case of storing three bits (for two pages) in one cell, the respective bits are switched over by the addresses (the first page, the second page, and the third page). Further, in the case of storing four bits in one cell, the respective bits are switched over by the addresses (the first page, the second page, the third page, and the fourth page).

Figure 9:
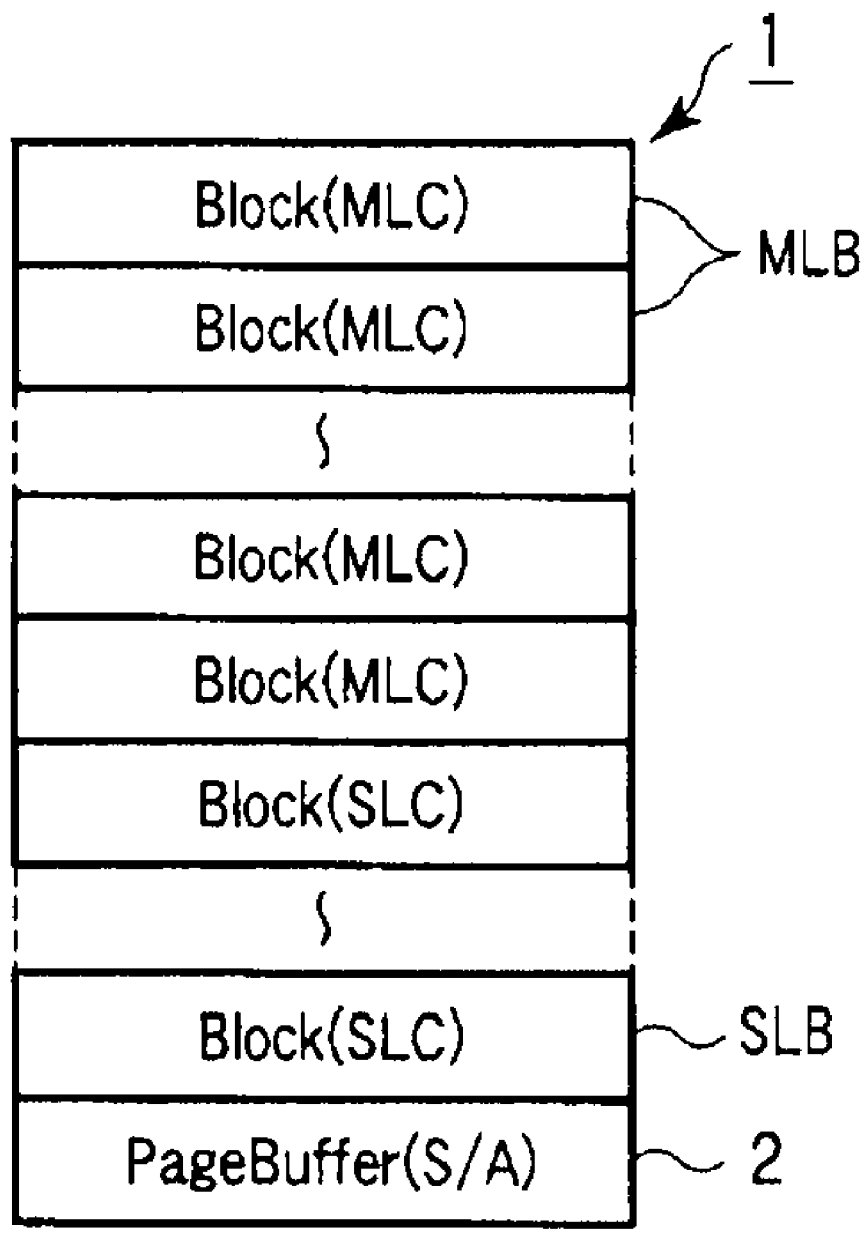
FIG. 9 is a configuration diagram schematically illustrating a storage region of a memory cell array.

FIG. 9 schematically illustrates a configuration of a storage region of the memory cell array. The memory cell array 1 has a plurality of blocks as described above. In this embodiment of the invention, the blocks are defined as a multi-bit block MLB and a binary block SLB. The MLB is configured by a multi-level cell MLC that stores n bits (where, n is a natural number that is equal to or larger than 2) in one memory cell, and the SLB is configured by a binary level cell that stores K bits (where, k<n) in one memory cell. In the embodiment of the invention, for simplification, it is assumed that the numbers n and k are set to n=2 and k=1, the MLB stores four-value data (two bits), and the SLB stores binary data (one bit). The positions of the MLB and the SLB in the memory cell array 1 are optional. Addresses of the MLB and the SLB are controlled by the control unit 9 as, for example, a host controller as illustrated in FIG. 1.

Also, in this embodiment of the invention, as illustrated in FIG. 3, a case of collectively writing and reading all of the cells which are parallel in a row direction will be described.

Figure 10:
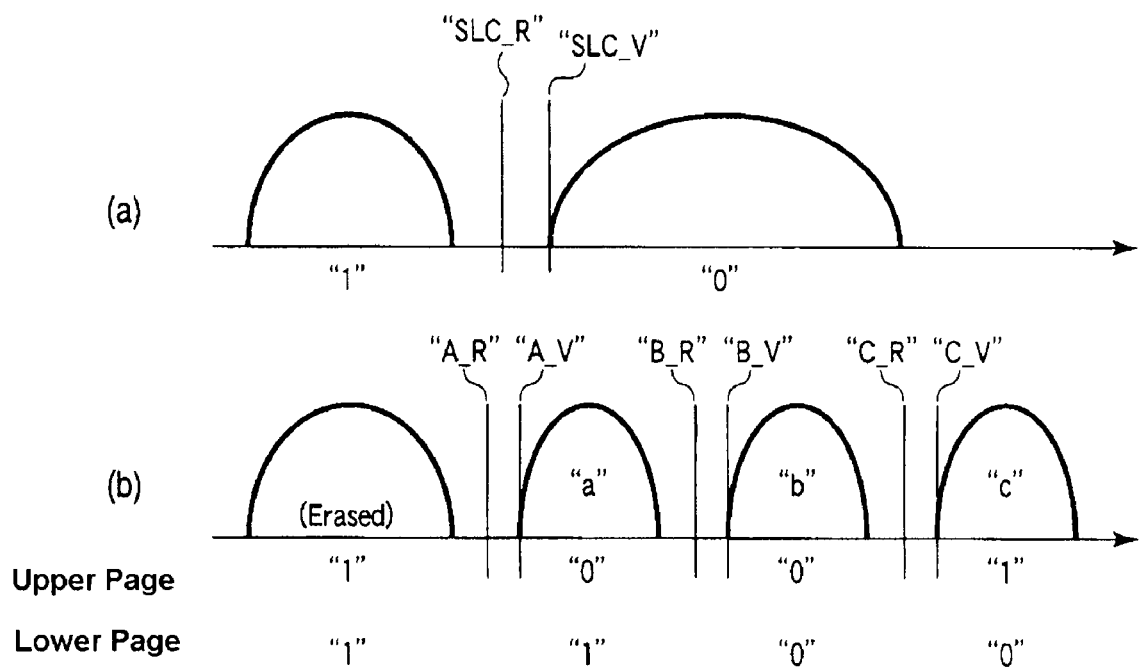
FIG. 10A is a diagram illustrating the threshold value distribution of a binary region SLB as illustrated in FIG. 9.
FIG. 10B is a diagram illustrating the threshold value distribution of a multi-bit region MLB as illustrated in FIG. 9.

FIG. 10A illustrates a threshold value voltage of a memory cell in a binary region and a read level. The data of the memory cell becomes the threshold value voltage of "1" by an erase operation, and becomes the threshold value voltage of "0" by a write operation of data "0".

For the read operation, a level SLC_R between threshold value voltages of data "1" and "0" is used. In order to have a data retention margin, a level SLC_V that is somewhat higher than the level SLC_R during the read operation is used as the verify level during the write operation.

FIG. 10B illustrates a threshold value voltage of a memory cell in a four-bit region and a read level. The data of the memory cell becomes the threshold value voltage of "11" by an erase operation, and becomes the threshold value voltages of "01", "00", and "10" by a write operation of data of two pages (a lower page and an upper page). For the read operation, read levels "A_R", "B_R", and "C_R", which correspond to the values between the respective threshold value voltages, are used. In order to have a data retention margin, levels A_V, B_V, and C_V which is somewhat higher than the levels during the read operation is used as the verify level during the write operation.

Figure 11:
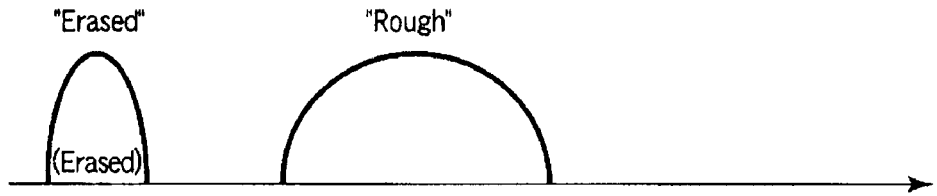
FIGS. 11A to 11E are diagrams illustrating a write operation in a multi-bit region MLB as illustrated in FIG. 9.
Figure 11:
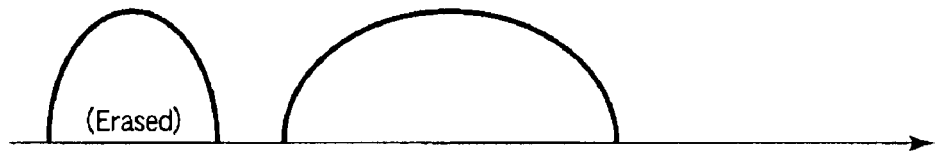
Figure 11:
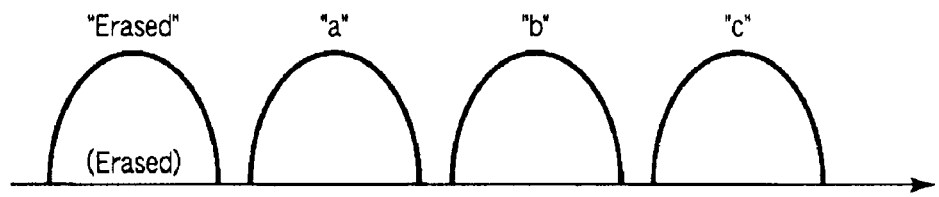
Figure 11:
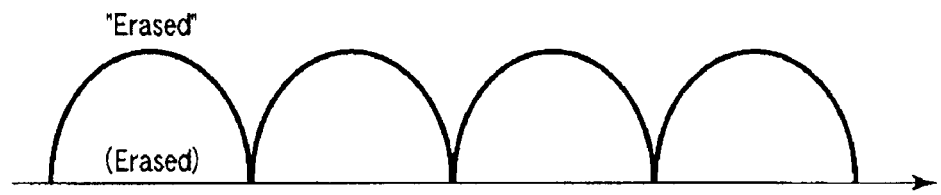
Figure 11:
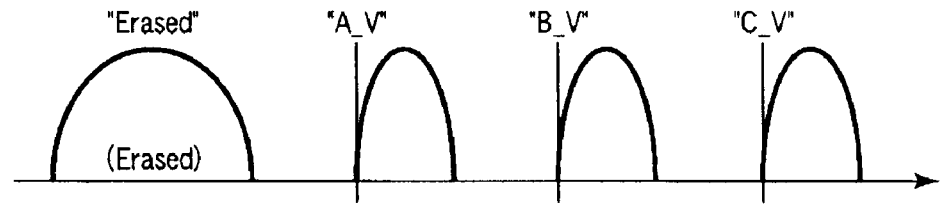

FIG. 11 illustrates a transition of threshold value voltages of a memory cell by four-bit data writing.
Program
Writing in High-Speed Write Region The data written on the outside is first written in the SLB (high-speed write region) as illustrated in FIG. 9 as binary data. That is, in this embodiment of the invention, the data written in one MLC is written in two SLCs as binary data. The cell SLC that constitutes the SLB stores one bit for one cell, and the cell MLC that constitutes the MLB stores two bits for one cell. Accordingly, in order to write data in one MLC, twice the number of SLCs is necessary. In this embodiment of the invention, the number of SLBs and the number of MLBs can be varied in an answer to a user's need.

As illustrated in FIG. 10A, if the data on the outside is "0" with respect to the SLC in an erased state, writing is performed, while if the data on the outside is "1", writing is not performed, but the erased state is maintained.

Figure 12:
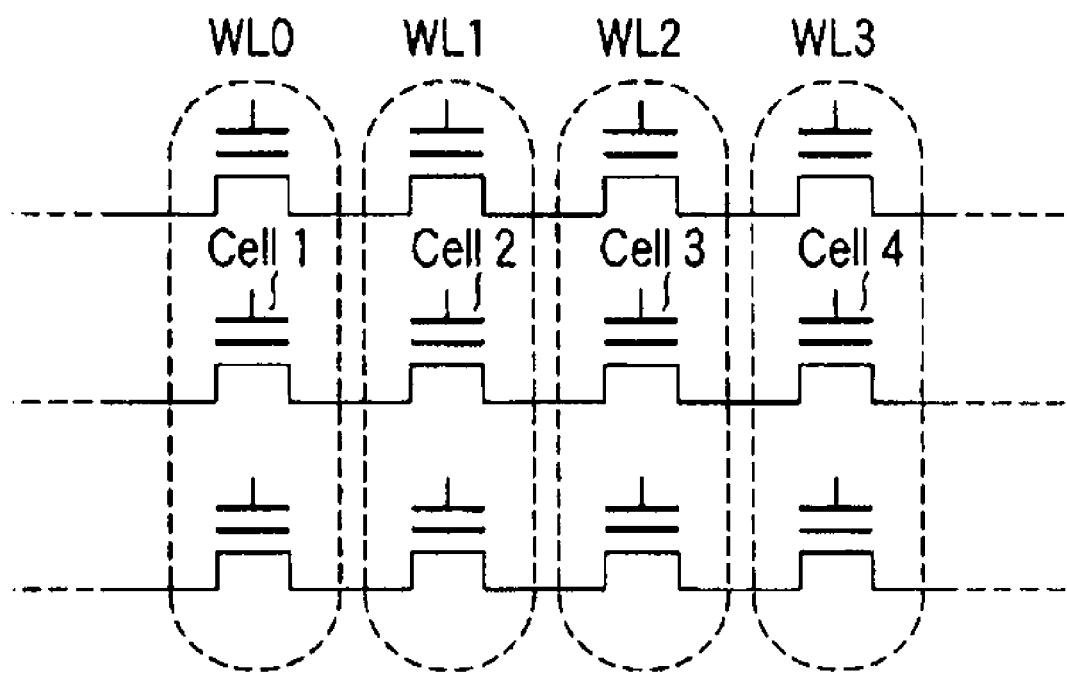
FIG. 12 is a diagram illustrating an example of the order of writing in a memory cell.

As described above, the write data is sequentially written in the SLC of the SLB. Since the writing in the SLC is the writing of binary data, high-speed writing is possible. After the data is written in the SLC, the data in the SLC is transferred to and stored in the MLC that constitutes the MLB as the multi-bit data.
Four-Bit Data Writing In the MLC, for example, as illustrated in FIGS. 11A to 11E, three-step writing is performed, and the data read from the SLC is written in the MLC as the multi-bit data. In this embodiment, although three-step writing is performed, it is also possible to perform the writing in two steps, four steps, or the like. For example, in the cell Cell1 as illustrated in FIG. 12, which is in an erased state as illustrated in FIG. 11A, data "Rough" is roughly written. Then, data is written in the neighboring cell Cell2. Following the writing in the neighboring cell Cell2, the threshold value voltage of the cell Cell1 first written is somewhat broadened so that the threshold value voltage is heightened as illustrated in FIG. 11B. Then, as illustrated in FIG. 11C, data "a", "b", and "c" are roughly written.

Thereafter, data are written in a cell Cell3 which is apart for two cells from the cell Cell1 (the cell neighboring the cell Cell2) and the cell Cell2 neighboring the cell Cell1. Following the writing in the cells Cell3 and Cell2, the threshold value voltage of the cell Cell1 first written is somewhat broadened so that the threshold value voltage is heightened as illustrated in FIG. 11D. Then, with respect to the cell Cell1, as illustrated in FIG. 11E, fine writing is performed according to write verify levels "A_V", "B_V", and "C_V", so that the threshold value voltages of the respective data "a", "b", and "c" are precisely written. As the above-described operation is repeated, multi-bit data are written in the respective cells of the MLB.

In this case, in the writing in the MLB, the binary data in the amount of one page or two pages, which is read from the SLB, is once stored in one or two of the data latch circuits ADL, BDL, and XDL as illustrated in FIG. 8, and then is written in the MLB.

Figure 13:
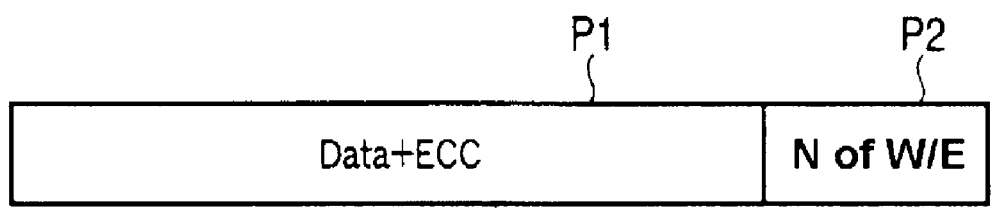
FIG. 13 is a diagram illustrating the configuration of one page.

FIG. 13 illustrates a configuration example of a page inside the SLB and MLB. This page is composed of a region P1 for storing data and error correction code (ECC) and a region P2 for storing the number of writes/reads (W/E) of the SLB or MLB, for example, the number of erases. With respect to one SLB or MLB, one region P2 is set. The number of W/E stored in the region P2 is managed by, for example, the control unit 9.

Figure 14:
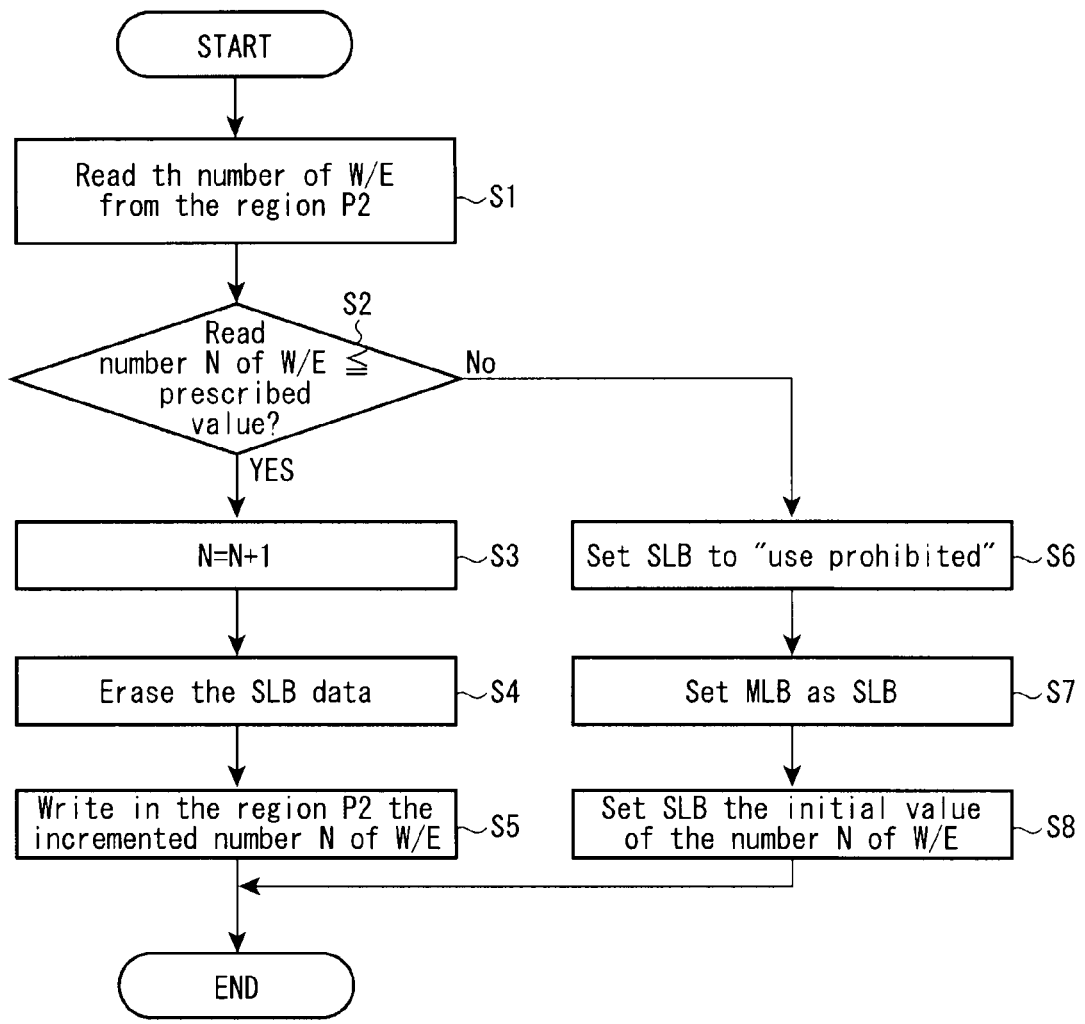
FIG. 14 is a flowchart illustrating an operation according to a first embodiment.

FIG. 14 illustrates an erase operation of the SLB that is performed by the control unit 9. The control unit 9, during the erase of the SLB, first reads the number N of W/E from the region P2 (step S1). It is judged whether the read number N of W/E is equal to or smaller than a prescribed value (step S2). If the number N of W/E is equal to or smaller than the prescribed value, the number of W/E is incremented (steps S3). Then, the data of the SLB is erased (step S4). Thereafter, the incremented number N of W/E is written in the region P2 of the SLB (step S5).

On the other hand, if it is judged that the number N of W/E reaches the prescribed value in step S2, the SLB is set to "use prohibited" (step S6), and the MLB in an erased state is set as the SLB (step S7). Thereafter, the initial value of the number N of W/E, for example, "0" is set in the SLB (step S8). On the other hand, if the number of W/E, which has been used as the MLB, is already known, this number of W/E is continuously used. As described above, in the case of setting the MLB as the SLB, a known leveling operation is performed so that the number N of W/E of each SLB becomes uniform.

In the above-described configuration, it is assumed that the memory cell MLC of the multi-bit region MLB stores two bits per cell, the memory cell SLC of the binary region SLB stores one bit per cell, the number N of writes/reads (W/E) of the memory cell MLC of the MLB is set to 1 k (k=1000), the number N of W/E of the memory cell SLC of the SLB is set to 50 k, and the storage capacity of the SLB is 2% of the storage capacity of the MLB. In this case, the memory cell SLC of the SLB is in a use inhibited state if the number N of W/E reaches 50 k. At this time, if it is assumed that the leveling is performed, the respective MLB performs rewriting 500 times. Thereafter, the memory cell MLC of the MLB is used as the SLC. The MLB requires writing of binary data in the amount of two cells with respect to the writing of multi-bit data for one cell. Accordingly, the number of writings of the multi-bit data becomes ⅓, and thus the number of rewritings of the multi-bit data becomes 500+500/3=667.

In this case, it is also possible to use the MLB as the SLB by first leveling the memory cell MLC of the multi-bit region MLB without installing the dedicated binary region SLB as in the first embodiment. Even in this case, in the case of writing the multi-bit data in one cell of the MLB, it is necessary to write binary data in two cells of the SLB. Accordingly, the number of writings of the multi-bit data becomes ⅓, and thus the number of rewritings of the multi-bit data becomes 1000/3=333.

As described above, until the predetermined number of SLBs are all in a use-prohibited state, the MLB is replaced with SLB whenever the number of W/E of the SLB reaches the prescribed value.

Figure 15:
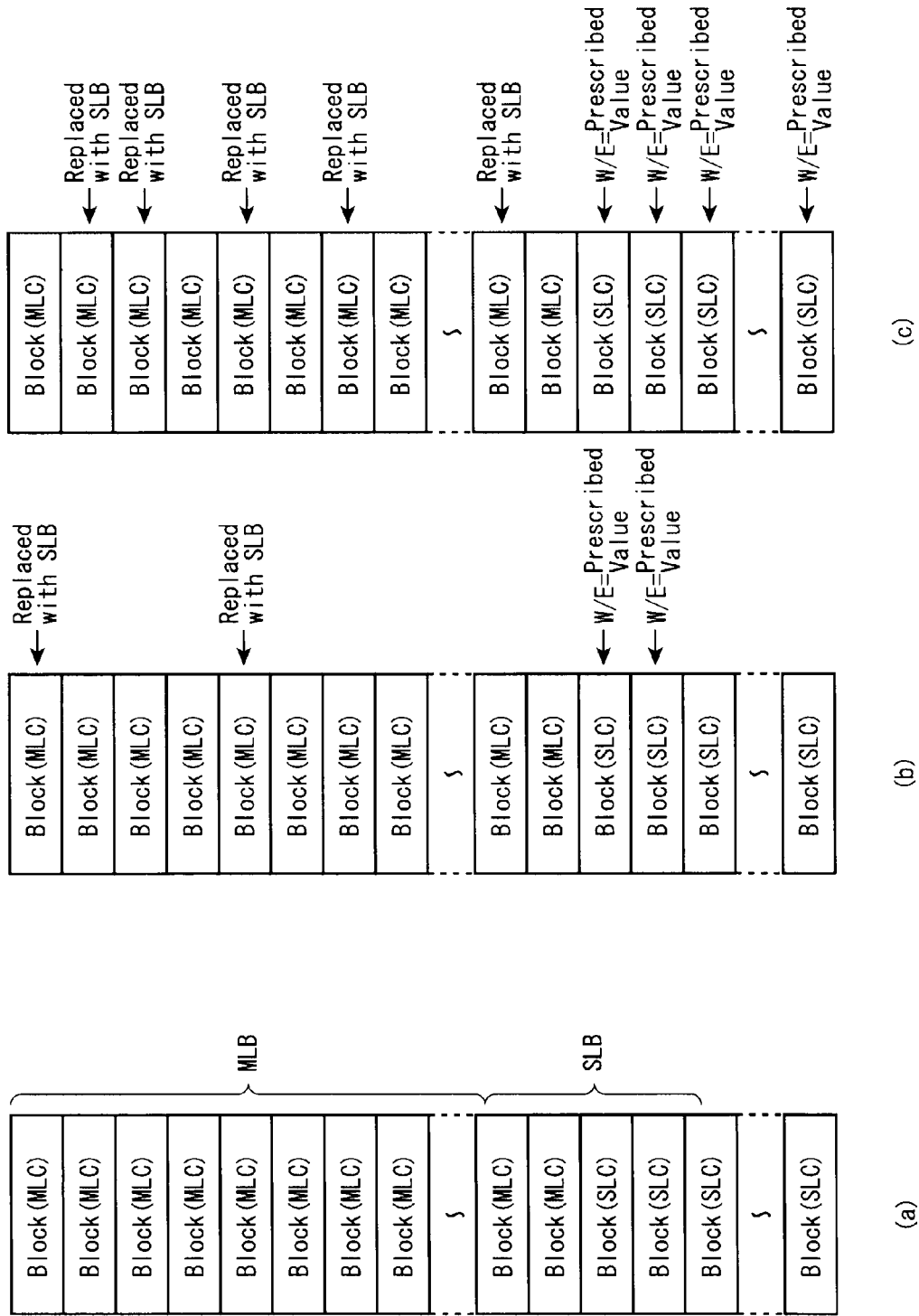
FIGS. 15A to 15C are diagrams illustrating an operation according to a first embodiment.

FIGS. 15A, 15B, and 15C illustrate the use state of the multi-bit region MLB and the binary region SLB according to the first embodiment of the invention. As illustrated in FIG. 15A, a plurality of SLBs is set with respect to a plurality of MLBs. In this state, as illustrated in FIG. 15B, if the number of W/E of the SLB reaches the prescribed value, the SLBs become invalid, the use thereof is prohibited, and a portion of the MLBs is replaced with the SLBs. FIG. 15C illustrates a state in which all of the predetermined SLBs become invalid and accordingly the MLBs are replaced with the SLBs.

Reading

The data stored in the memory cell MLC of the multi-bit region MLB is read using read levels "A_R", "B_R", and "C_R" as illustrated in FIG. 10B, and is output to the outside as two-bit data.

According to the first embodiment, if a binary region SLB is provided in order to write multi-bit data in the memory cell MLC of the multi-bit region MLB and the number of W/E of the SLB reaches the prescribed value, the use of the SLB is prohibited, and the MLB is leveled to be used as the SLB. Accordingly, it is not necessary to make the predetermined number of SLBs large, and even in the case where the predetermined SLB has disappeared, the deterioration of the writing speed is prevented by replacing the MLB with the SLB, and thus the life span of the semiconductor memory device can be extended.

Second Embodiment

Figure 16:
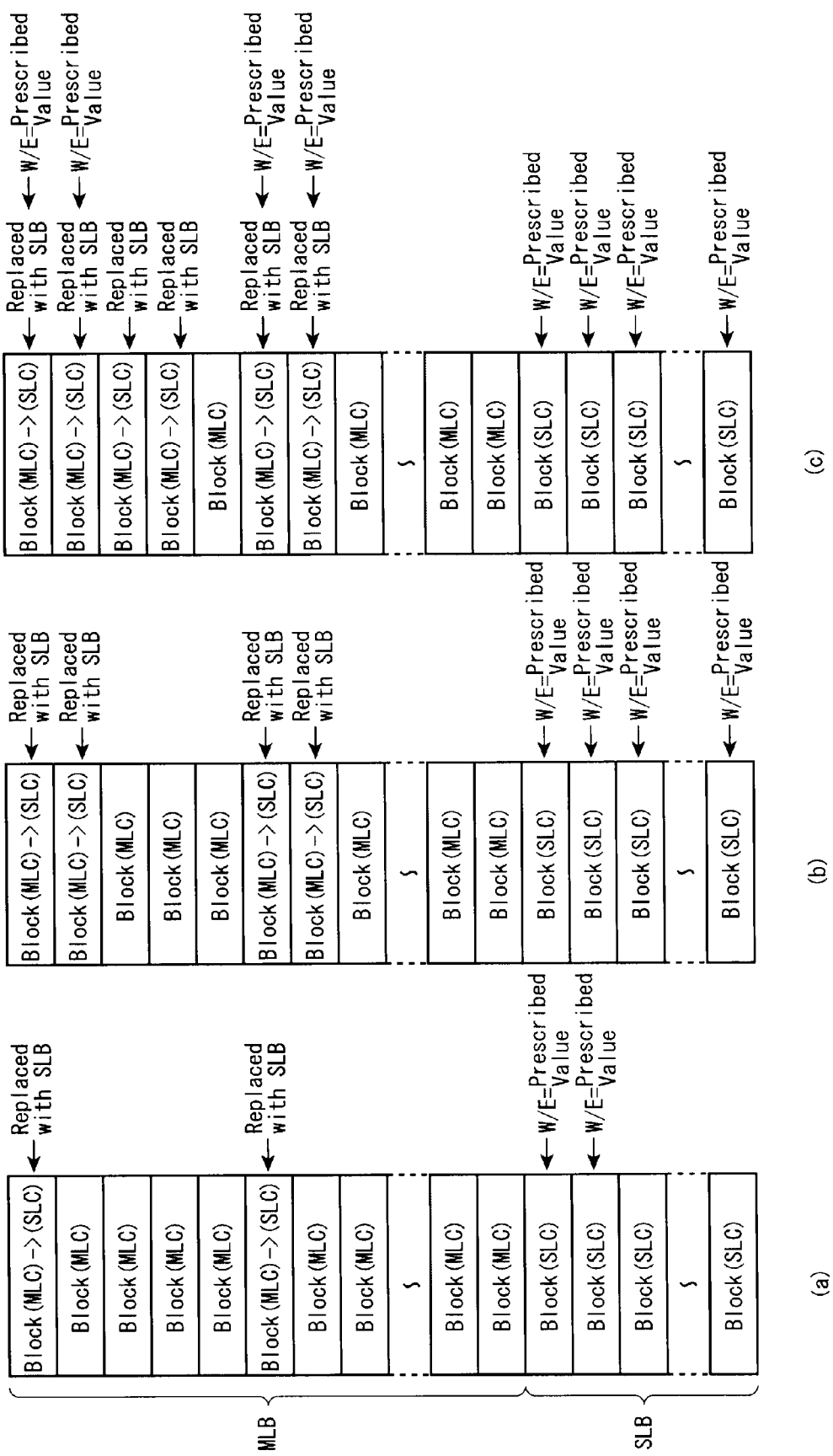
FIGS. 16A to 16C are diagrams illustrating an operation according to a second embodiment.

FIGS. 16A to 16C are diagrams illustrating the use state of the multi-bit region MLB and the binary region SLB according to a second embodiment of the invention.

In the first embodiment of the invention, if the predetermined number of W/E of the SLB reaches the prescribed value, a portion of the MLB is used as the SLB without performing writing with respect to the SLB, and the MLB is leveled to be used as the SLB. Accordingly, in order to use the MLB as the SLB, the number of rewritings in the MLC becomes smaller.

By contrast, in the second embodiment of the invention, even if all of the predetermined SLBs have been replaced with the MLBs, the number of rewritings in the MLC does not become smaller.

That is, as illustrated in FIG. 16A, the number of W/E of the SLB reaches the successive prescribed value, and the MLB is replaced with the SLB. FIG. 16B illustrates that the number of W/E of all the SLBs, which have been used as the original SLBs, reaches the successive prescribed value, and the MLBs have been replaced with the SLBs.

Also, as shown in FIG. 16C, if the number of W/E of the SLBs, which have been obtained through the replacement of the MLBs, reaches the prescribed value, one of the remaining MLBs is again replaced with the SLB. As described above, although the memory capacity is decreased with the increase of the number or W/E, the number of rewritings in the MLC is not reduced.

Also, with the decrease of the memory capacity, a user can recognize that the deterioration of the memory cells is in progress.

Here, for example, if the number N of W/E of the memory cell SLC of the SLB reaches 50 k under the assumption that the memory cell MLC of the multi-bit region MLB stores two bits per cell, the memory cell SLC of the binary region SLB stores one bit per cell, the number of rewritings in the memory cell MLC of the MLB is set to 1 k, the number of rewritings in the memory cell SLC of the SLB is set to 50 k, and the storage capacity of the SLB is 2% of the storage capacity of the MLB, the SLB becomes invalid. At this time, if it is assumed that the leveling is performed, the MLB performs the rewriting 500 times. Here, a portion of the MLBs is used as the SLBs. Although the number of rewritings of the multi-bit data is 1 k, the storage capacity is reduced by 2% after the rewriting of the multi-bit data is performed 500 times.

On the other hand, for example, if the number N of W/E of the memory cell SLC of the binary region SLB reaches 10 k under the assumption that the memory cell MLC of the multi-bit region MLB stores two bits per cell, the memory cell SLC of the binary region SLB stores one bit per cell, the number of rewritings in the memory cell MLC of the MLB is set to 1 k, the number of rewritings in the memory cell SLC of the SLB is set to 10 k, and the storage capacity of the SLB is 2% of the storage capacity of the MLB, the SLB becomes invalid. At this time, if it is assumed that the leveling is performed, the MLB performs the rewriting 100 times. Here, a portion of the MLBs is replaced with the SLBs. Accordingly, the storage capacity is reduced again by 2%. Thereafter, if the number of writings in the SLB reaches 10 k again, the MLB, under the assumption that the leveling is performed, performs the rewriting 200 times. Here, a portion of the MLBs is replaced with the SLBs. Accordingly, the storage capacity is reduced by 4%. As described above, if a portion of new MLBs is used as SLBs whenever the number of writings in the SLB reaches the possible number of rewritings in the SLC, the MLB can be used up to the possible number of rewritings of the original multi-bit data. That is, in this embodiment, since the number of rewritings in the MLC is set to 1 k, the life time of the semiconductor memory device can be lengthened.

According to the second embodiment of the invention, the number of writings in the MLB, which has been replaced with the SLB, is judged after the predetermined SLB have become invalid, and if the number of writings in the SLB reaches the prescribed value, the SLB becomes invalid, and a portion of the remaining MLBs is further replaced with the SLB. Accordingly, although the storage capacity is reduced, it is possible to lengthen the life span of the semiconductor memory device in a state where the writing speed is kept high.

In the first and second embodiments of the invention, it is not necessary to fix the position of the SLB. It is possible to set the positions of the SLB and MLB in certain positions inside the memory cell array 1.

Third Embodiment

Figure 17:
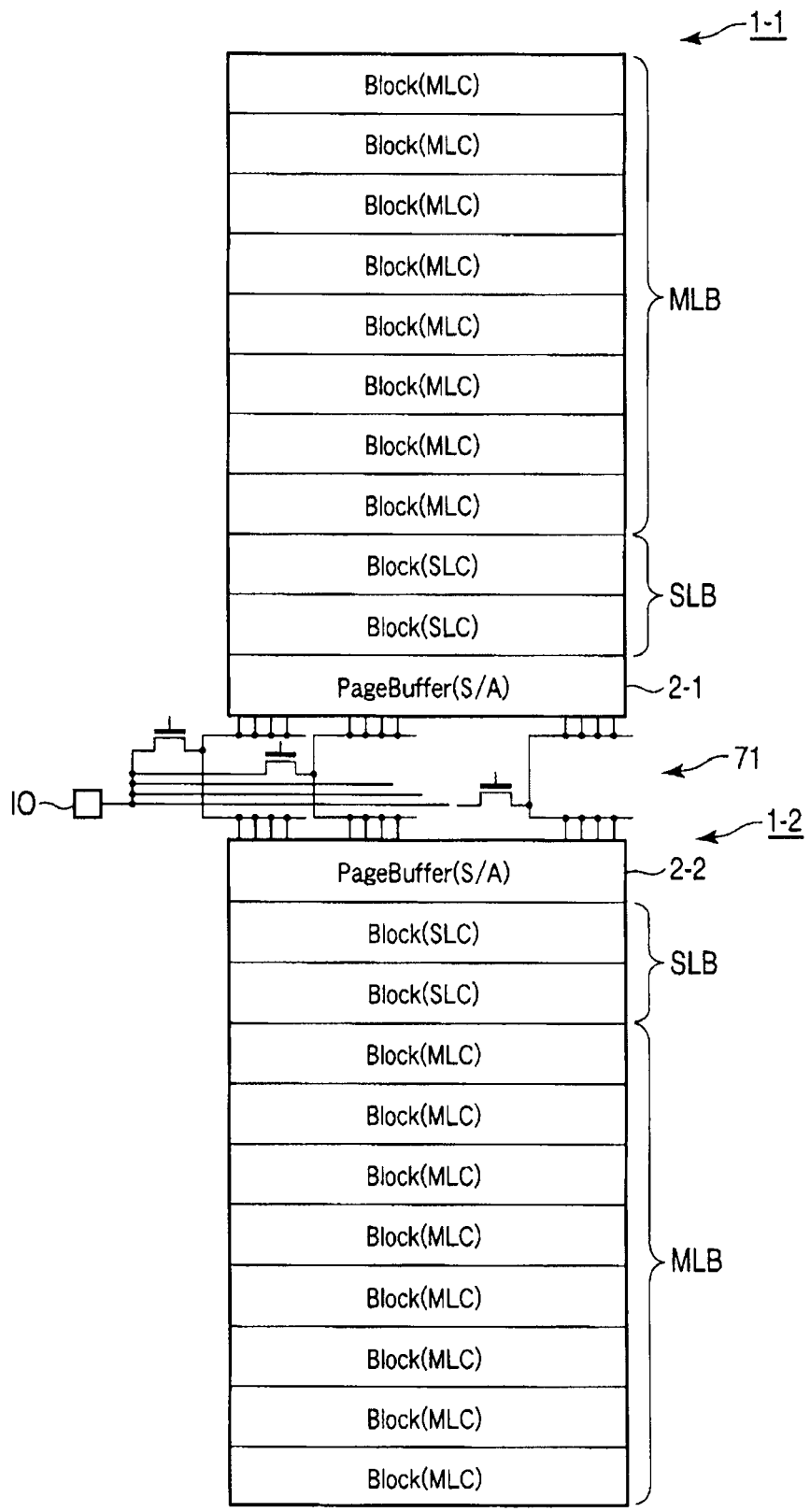
FIG. 17 is a diagram illustrating a third embodiment.

FIG. 17 is a diagram illustrating a third embodiment, and shows the relationship among the data storage circuit 10 as the page buffer as illustrated in FIGS. 7 and 8, the binary region SLB, and the multi-bit region MLB. For example, when writing is performed in a block of a plurality of MLBs that store two bits per cell, the writing should be performed, for example, as much as two blocks in the SLB that stores one bit per cell. The SLB should be written for one page therein per block, and if the SLB and the MLB exist in the same memory cell array, time may cause a problem in performing writing in the SLB. Accordingly, in order to heighten the speed of writing in the SLB, for example, it is considered to write the SLB for two blocks in each page inside each block of a plurality of SLBs in two memory cell arrays. That is, data are simultaneously written in one block of the plurality of SLBs in the first memory cell array and in one block of the plurality of SLBs in the second memory cell array. Then, the data in the SLB of the first memory cell array and the data in the SLB of the second memory cell array are transferred to one MLB inside the first memory cell array or the second memory cell array. By doing this, high-speed writing in the SLB becomes possible.

However, the data in one SLB which is read from the first or second memory cell array and is maintained in the page buffer is required to be transferred to the page buffer of the other memory cell array. Accordingly, a long time is required in moving the data.

Accordingly, in the third embodiment, as illustrated in FIG. 17, the data of plural bits, which are read from the SLB of the first memory cell array 1-1, are made so that they can be simultaneously transferred to the second memory cell array 1-2. Accordingly, a connection circuit 71 is installed for one to plural data storage circuits between the page buffer (S/A) 2-1 of the first memory cell array 1-1 and the page buffer (S/A) 2-2 of the second memory cell array 1-2.

Figure 18:
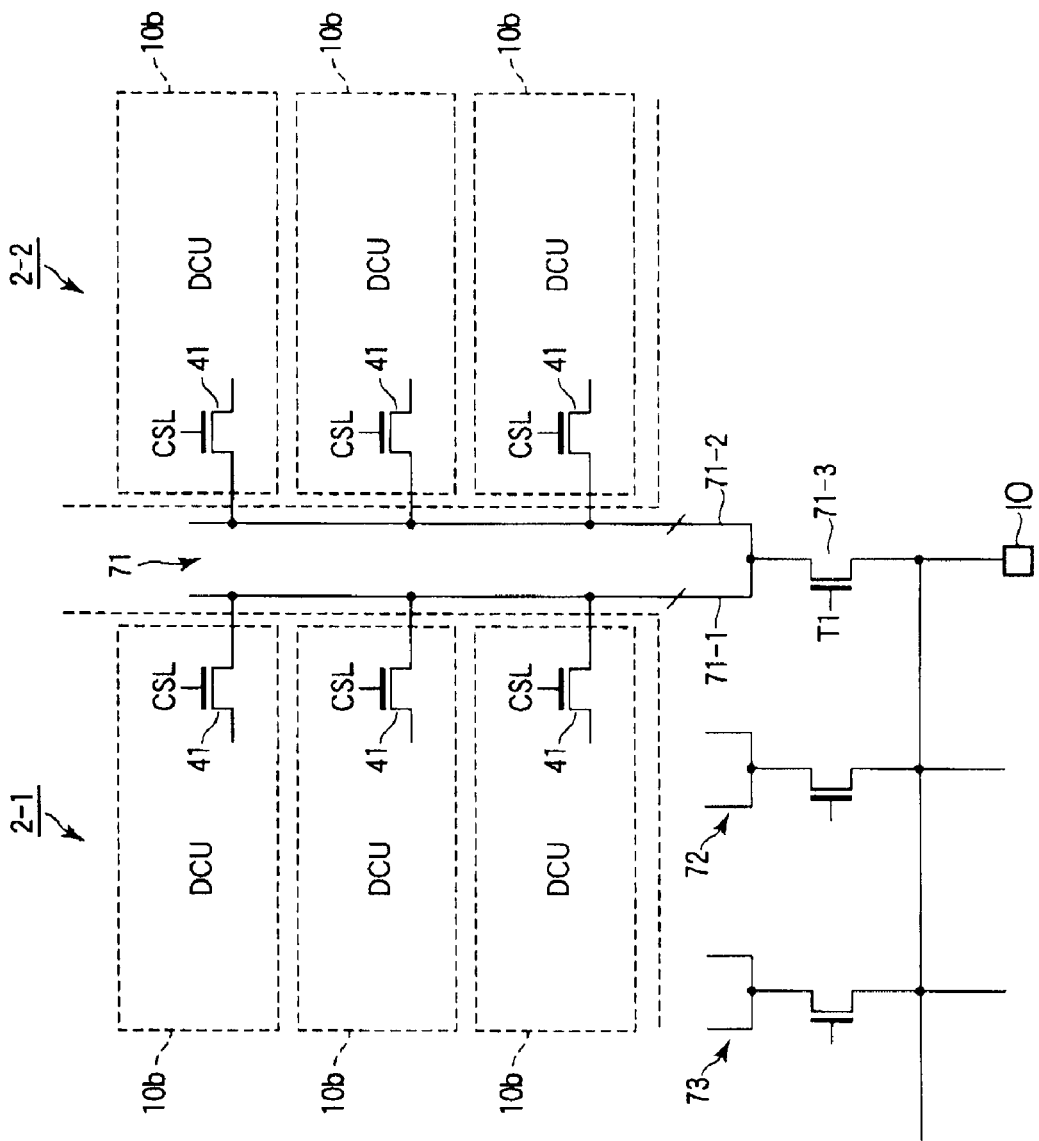
FIG. 18 is a circuit diagram of an extracted portion of FIG. 17.

FIG. 18 illustrates an example of a connection circuit 71. In FIG. 18, the same reference numerals are given to the same portions as those in FIG. 8. The page buffer (S/A) 2-1 arranged on the side of the first memory cell array 1-1 includes a plurality of data storage circuits 10, and a transistor 41 that constitutes the DCU of each data storage unit 10 is connected to an interconnection 71-1. Also, the page buffer (S/A) 2-2 arranged on the side of the second memory cell array 1-2 includes a plurality of data storage circuits 10, and a transistor 41 that constitutes the DCU of each data storage unit 10 is connected to an interconnection 71-2. For convenience in explanation, the interconnections 71-1 and 71-2 are indicated as one interconnection, respectively, and the transistors 71-3 are indicated as one transistor, respectively. However, specifically, if the number of transistors 41 included in the page buffer (S/A) 2-1 is 8 k, the interconnection 71-1 is composed of 1 k-numbered interconnections, and every eight transistors 41 are connected to the interconnection. The interconnection 71-2 is configured in the same manner as the interconnections 71-1, and if the number of transistors 41 included in the page buffer (S/A) 2-2 is, for example, 8 k, they are connected by 1 k-numbered interconnections, and every eight transistors 41 are connected to the corresponding interconnection. One end portion of the interconnection 71-1 and the interconnection 71-2 are connected to an input/output terminals 10 through the transistor 71-3. The transistor 71-3 is composed of transistors of which the number is the same as that of the interconnections 71-1 and 71-2. Specifically, the transistor 71-3 is composed 1 k-numbered transistors.

A signal T1 is supplied to the gate electrode of the transistor 71-3. Connection circuits 72, 73, . . . are arranged between other memory cell arrays, and these connection circuits 72, 73, . . . are connected to the input/output terminal IO.

In the above-described configuration, a case in which data is written in the MLB of the first memory cell array 1-1 will be described. In this case, for example, data for one block is first written in the SLB on the side of the first memory cell array 1-1, and data for the remaining one block is written in the SLB on the side of the second memory cell array 1-2. That is, the signal T1 becomes H level, and the transistor 71-3 is turned on. In this state, for example, a signal CSL, which is supplied to the plurality of transistors 41 that constitute the page buffer (S/A) 2-1 on the side of the first memory cell array 1-1, becomes H level. Accordingly, the data for one block that is input to the input/output terminal 10 is transferred to the data storage circuit (page buffer (S/A) 2-1) on the side of the first memory cell array 1-1. In this state, the signal CSL on the side of the page buffer (S/A) 2-1 become low (L) level, and the signal CSL, which is supplied to the plurality of transistors 41 that constitute the page buffer (S/A) 2-2 on the side of the second memory cell array 1-2, becomes H level. Accordingly, the remaining data input to the input/output terminal 10 is transferred to the data storage circuit (page buffer (S/A) 2-2) on the side of the second memory cell array 1-2.

Thereafter, the data transferred to the data storage circuit on the side of the first memory cell array 1-1 and the data transferred to the data storage circuit on the side of the second memory cell array 1-2 are simultaneously written in the SLB of the first memory cell array 1-2 and the SLB of the second memory cell array 1-2.

By doing this, after one-block data is written in the SLB of the first memory cell array 1-1 and in the SLB of the second memory cell array 1-2, the data for one page in the SLB of the first memory cell array 1-1 and the data for one page in the SLB of the second memory cell array 1-2 are read and maintained in the corresponding data storage circuits (page buffers (S/A) 2-1 and 2-2).

Thereafter, if a signal T1 becomes L level, the data read from the page buffer (S/A) of the first memory array 1-1 or the data read from the data storage circuit (page buffer (S/A) 2-2) of the second memory array 1-2 is transferred to the data storage circuit (page buffer (S/A) of the other side memory cell array.

Then, the data for two pages, which is maintained in the data storage circuit (data of the page buffer) of the first memory cell array 1-1 or the second memory cell array 1-2, is written in the MLB of the first memory cell array 1-1 or the second memory cell array 1-2. In the case of a configuration example that is applied to the first and second embodiments, 8 k times transfer operations are required, while in the third embodiment, only 8 times transfer operations are required. Also, in the third embodiment, if the number of transistors 41 included in the page buffers (S/A) 2-1 and 2-2 is, for example, 8 k, every eight transistors 41 are connected to a corresponding interconnection, and thus the number of transistors 71-3 becomes 1 k. However, for example, if every 80 transistors 41 are connected to a corresponding interconnection, the number of transistors 71-3 becomes 100, and 80 times the transfer operations are performed.

According to the third embodiment, a connection circuit 71 for connecting the page buffer (S/A) 2-1 of the first memory cell array 1-1 and the page buffer (S/A) 2-2 of the second memory cell array 1-2 is installed between the first memory cell array 1-1 and the second memory cell array 1-2, and by this connection circuit 71, the data for two blocks which are written in the SLB are written by one block in the SLB of the first memory cell array 1-1 and in the SLB of the second memory cell array 1-2. Accordingly, when the data for two blocks are written in the SLBs, it is possible to write data for the remaining one block without waiting for the completion of writing of data for one block. Thus, time for writing data in the SLB can be shortened.

Also, since the data for one page written in the SLB of the first memory cell array 1-1 and the data for one page written in the SLB of the second memory cell array 1-2 are simultaneously read and transferred to the data storage circuit (page buffer (S/A) 2-1 of the first memory cell array 1-1 or the data storage circuit (page buffer (S/A) 2-2 of the second memory cell array 1-2 through the connection circuit 71, the data for one page written in the SLB of the first memory cell array 1-1 and the data for one page written in the SLB of the second memory cell array 1-2 are maintained in the data storage circuit (page buffer (S/A)) of the memory cells of one side memory cell array, and thus can be written in the MLB. Accordingly, by simultaneously storing the data for two blocks in the SLBs of the two memory cell arrays, the high-speed writing in the SLB becomes possible.

In this case, in the third embodiment, if the number of W/E in the SLBs of the first and second memory cell arrays 1-1 and 1-2 reaches the prescribed value, the MLB is replaced with the SLB in the same manner as the first or second embodiment.

Application Examples

Next, applications to which the semiconductor memory device is applied will be described.

Figure 19:
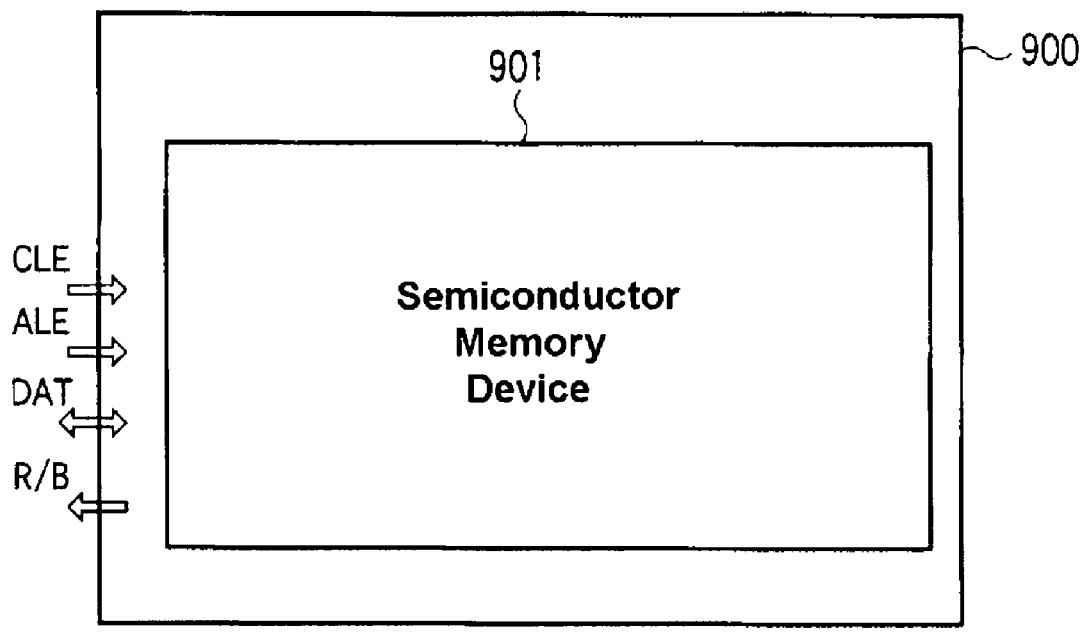
FIG. 19 is a configuration diagram illustrating an application to which a semiconductor memory device according to respective embodiments is applied.

FIG. 19 illustrates an example of a memory card to which the semiconductor memory device is applied. In FIG. 19, a memory card 900 has a semiconductor memory device 901 that includes a NAND flash memory as described in the embodiments. The semiconductor memory device 901 receives a predetermined control signal and data from an external device (not illustrated). Also, the semiconductor memory device outputs a predetermined control signal and data to the external device (not illustrated).

That is, the semiconductor memory device 901 mounted on the memory card 900 is connected to a signal line DAT for transmitting data, an address, or a command, a command line enable signal line CLE for indicating that the command is transferred through the signal line DAT, an address line enable signal line ALE for indicating that an address is transferred to the signal line DAT, and a ready/busy signal line R/B for indicating whether the flash memory is operable.

Figure 20:
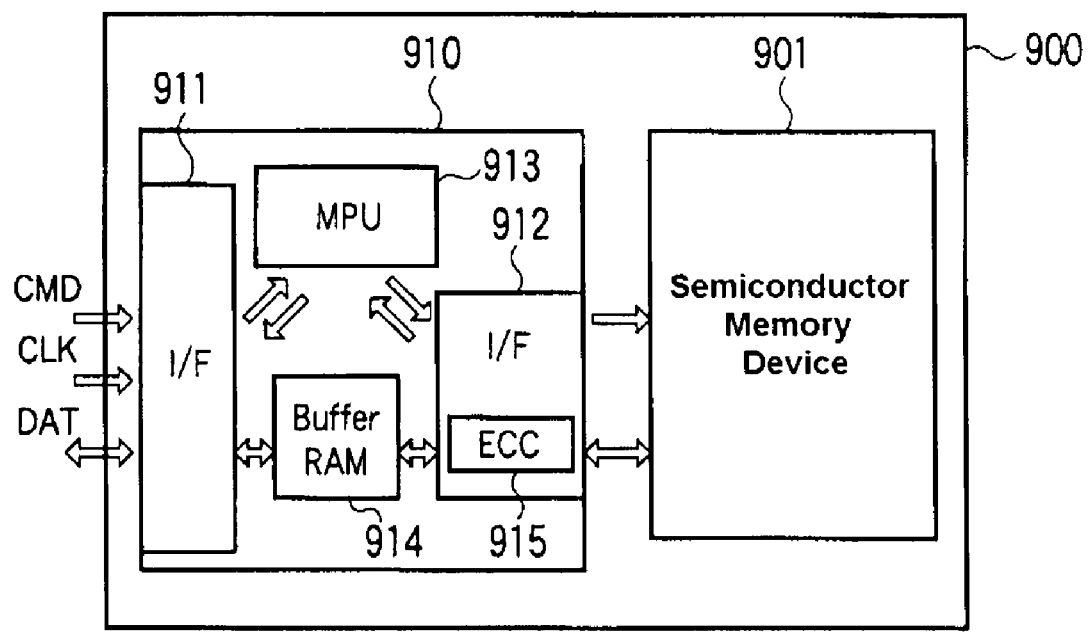
FIG. 20 is a configuration diagram illustrating an example of another application.

FIG. 20 illustrates an example of another memory card. This memory card, unlike the memory card as illustrated in FIG. 19, has a controller 910 which exchanges signals with an external device (not illustrated) by controlling the flash memory 901.

The controller 910 includes an interface (I/F) unit 911 that receives signals from or outputs signals to the external device (not illustrated), an interface unit 912 that sends/receives signals to/from the semiconductor memory device 901 including a NAND flash memory, a microprocessor (MPU) 913 that performs calculation such as conversion of a logical address input from the external device into a physical address or the like, a RAM 914 as a buffer for temporarily storing the data, and an error correction unit (ECC) 915 that generates an error correction code. Also, the interface unit 911 of the memory card 900 is connected to a command signal line CMD, a clock signal line CLK, and a signal line DAT.

In the memory card, the number of various kinds of signal lines, the bit width of the signal lines, and the configuration of the controller can be modified. It is also possible to configure an SSD (Solid State Drive) that is change to a hard disc by adopting this configuration.

Figure 21:
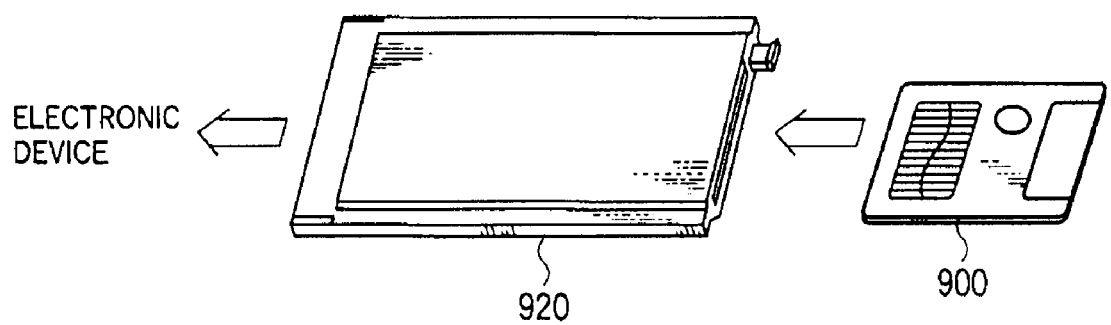
FIG. 21 is a configuration diagram illustrating an example of another application.

FIG. 21 illustrates another application. As illustrated in FIG. 21, the memory card 900 is inserted into a cardholder 920, and is connected to an electronic appliance (not illustrated). The card holder 920 may have a portion of the function of the controller 910.

Figure 22:
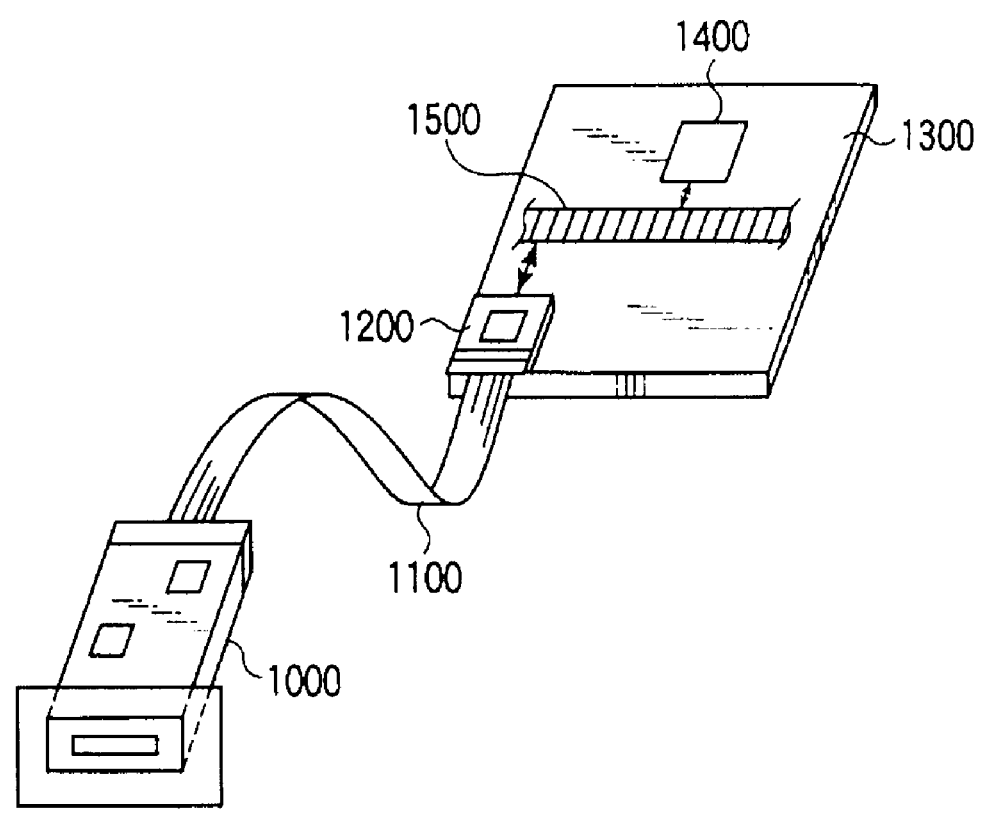
FIG. 22 is a configuration diagram illustrating an example of another application.

FIG. 22 illustrates still another application. A memory card 900 or a card holder 920, into which the memory card 900 is inserted, is inserted into a connection device 1000. The connection device 1000 is connected to a board 1300 through a wire connection 1100 and an interface circuit 1200. On the board 1300, a CPU 1400 or a bus 1500 is mounted.

Figure 23:
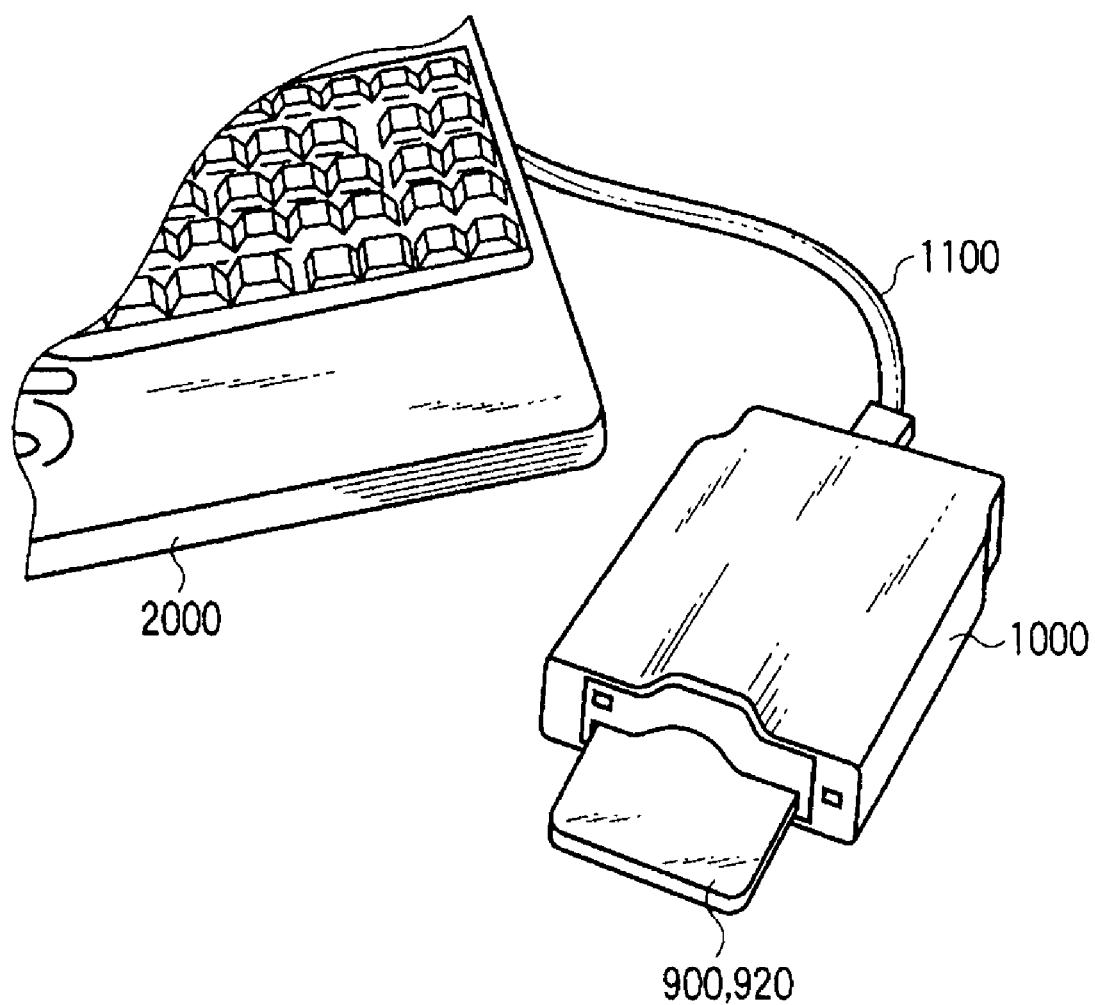
FIG. 23 is a configuration diagram illustrating an example of another application.

FIG. 23 illustrates still another application. A memory card 900 or a card holder 920, into which the memory card 900 is inserted, is inserted into a connection device 1000. The connection device 1000 is connected to a personal computer 2000 through a wire connection 1100.

Figure 24:
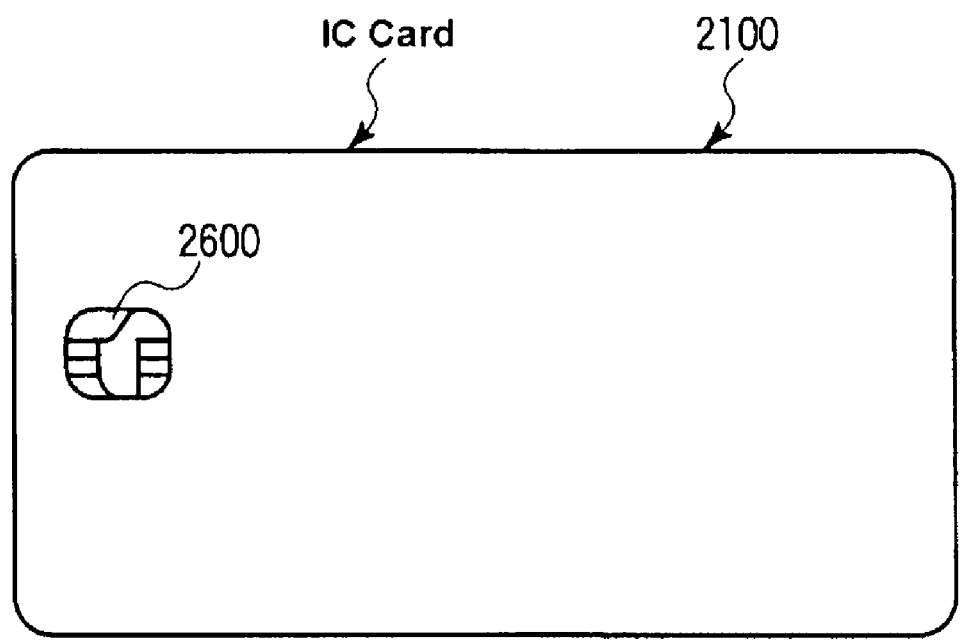
FIG. 24 is a configuration diagram illustrating an example of another application.
Figure 25:
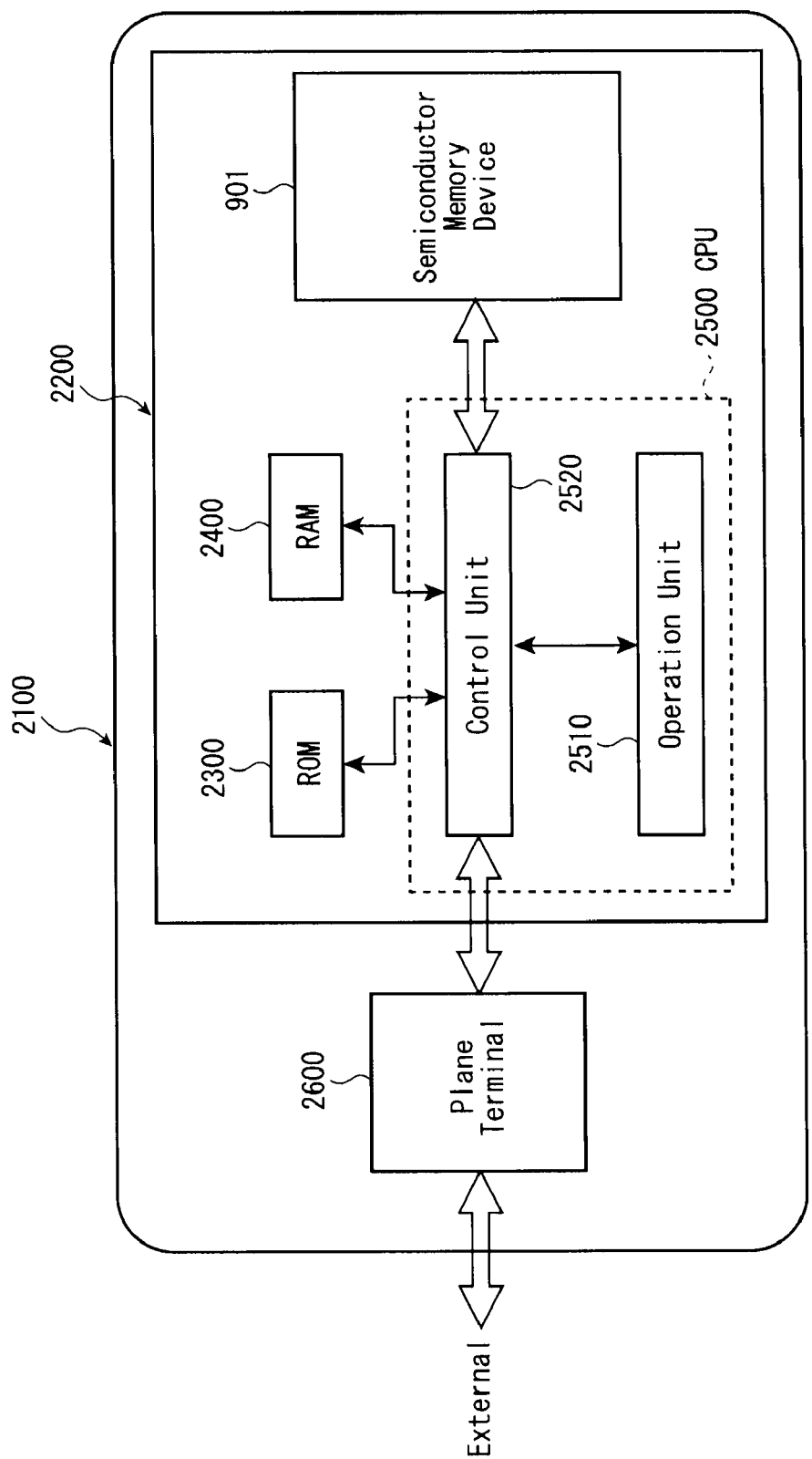
FIG. 25 is a configuration diagram illustrating an example of another application.

FIGS. 24 and 25 illustrate still another application. As illustrated in FIGS. 24 and 25, an IC card 2100 has an MCU 2200 mounted thereon. For example, the MCU 2200 is provided with a semiconductor memory device 901 including a NAND flash memory according to the above-described embodiments, a ROM 2300, a RAM 2400, and a CPU 2500. The IC card 2100, as illustrated in FIG. 24, has a plane terminal 2600 which is exposed to one surface thereof, and the plain terminal 2600 is connected to the MCU 2200. The CPU 2500 is provided with an operation unit 2510, and a control unit 2520 connected to the semiconductor memory device 901, the ROM 2300, and the RAM 2400.

Figure 26:
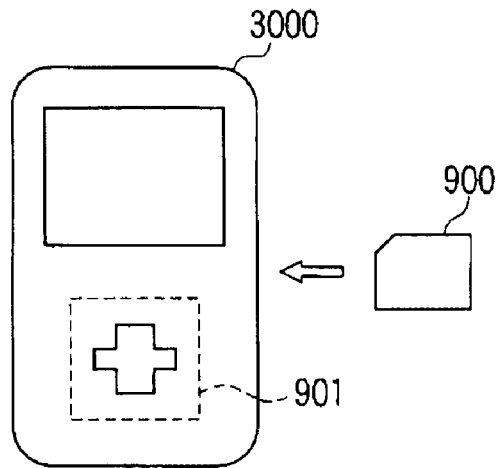
FIG. 26 is a configuration diagram illustrating an example of another application.

FIG. 26 illustrates still another application. For example, FIG. 26 illustrates an example of a portable music recording/reproducing device 3000. This portable music recording/reproducing device 3000, for example, has a semiconductor memory device 901 including a NAND flash memory according to the above-described embodiments, which is built in a main body. Further, a memory card 900 including the NAND flash memory can be mounted thereon.

Figure 27:
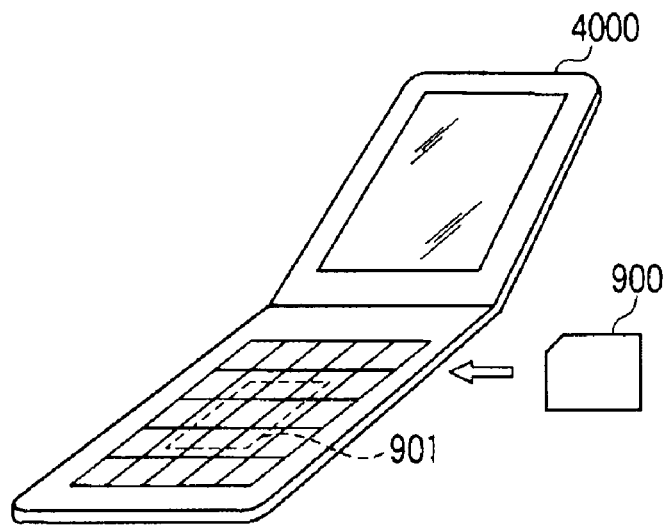
FIG. 27 is a configuration diagram illustrating an example of another application.

FIG. 27 illustrates still another application, and for example, illustrates a portable terminal device 4000 such as a portable phone. The portable terminal device 4000, for example, has a semiconductor memory device 901 including a NAND flash memory according to the above-described embodiments, which is built in a main body. Further, a memory card 900 including the NAND flash memory can be mounted thereon.

Figure 28:
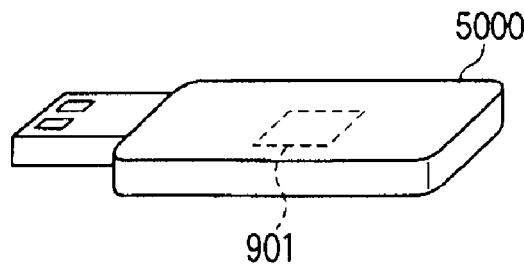
FIG. 28 is a configuration diagram illustrating an example of another application.

FIG. 28 illustrates still another application, and for example, illustrates a USB memory 5000. The USB memory 5000, for example, has a semiconductor memory device 901 including a NAND flash memory according to the above-described embodiments, which is built in a main body. In addition, diverse modifications are possible, without departing from the scope of the invention.

What is claimed is:

1. A nonvolatile semiconductor memory device comprising a plurality of memory cells which store n-bit (where n is a natural number that is equal to or larger than 2) data for one cell;
    wherein among the plurality of memory cells, h-bit ($h \leq n$) data is stored in memory cells of a first region, i-bit ($i < h$) data is stored in memory cells of a second region, and if the number of rewritings in the memory cells of the second region reaches a prescribed value, the i-bit data is stored in the memory cells of the first region rather than the memory cells of the second region; and
    in the memory cells of the first region, a region for storing the i-bit data and a region for storing the h-bit data are exchanged with each other whenever a rewrite operation is performed.

2. A nonvolatile semiconductor memory device comprising a plurality of memory cells which store n-bit (where n is a natural number that is equal to or larger than 2) data for one cell;
    wherein among the plurality of memory cells, h-bit ($h \leq n$) data is stored in memory cells of a first region, i-bit ($i < h$) data is stored in memory cells of a second region, and if the number of rewritings in the memory cells of the second region reaches a prescribed value, the memory cells of a portion of the first region is set as a third region that is a new second region, and the i-bit data is stored in the third region rather than the memory cells of the second region.

3. The nonvolatile semiconductor memory device according to claim 2, wherein if the number of rewritings in the memory cells of the third region that is installed in the portion of the first region reaches the prescribed value, a fourth region is set as the new second region in the portion of the first region, which is different from the third region, and the i-bit data is stored in the fourth region rather than the memory cells of the third region.

4. A nonvolatile semiconductor memory device comprising a plurality of memory cells which store n-bit (where n is a natural number that is equal to or larger than 2) data for one cell;
    wherein among the plurality of memory cells, h-bit ($h \leq n$) data is stored in memory cells of a first region, i-bit ($i < h$) data is stored in memory cells of a second region, the first region and the second region are exchanged whenever a rewrite operation is performed, and if the number of rewritings reaches a prescribed value, no data is written.

* * * * *